(12) United States Patent
Engelhardt

(10) Patent No.: US 8,575,026 B2
(45) Date of Patent: Nov. 5, 2013

(54) METHOD OF PROTECTING SIDEWALL SURFACES OF A SEMICONDUCTOR SUBSTRATE

(75) Inventor: Manfred Engelhardt, Villach Landskron (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/288,054

(22) Filed: Nov. 3, 2011

(65) Prior Publication Data

US 2013/0115771 A1 May 9, 2013

(51) Int. Cl.
*H01L 21/44* (2006.01)

(52) U.S. Cl.
USPC .................. 438/675; 257/774; 438/700

(58) Field of Classification Search
USPC .............. 257/773, 774, E21.575, E21.577, 257/E21.578; 438/675, 689, 700–702, 713
See application file for complete search history.

(56) References Cited

U.S. PATENT DOCUMENTS

| | | | | |
|---|---|---|---|---|
| 4,956,312 A | * | 9/1990 | Van Laarhoven | 438/639 |
| 6,027,966 A | * | 2/2000 | Saenger et al. | 438/239 |
| 6,117,347 A | * | 9/2000 | Ishida | 216/52 |
| 6,699,392 B1 | * | 3/2004 | Manginell et al. | 210/656 |
| 2002/0179903 A1 | * | 12/2002 | Seki | 257/48 |
| 2002/0192911 A1 | * | 12/2002 | Parke | 438/270 |
| 2005/0248034 A1 | * | 11/2005 | Takayama et al. | 257/758 |

OTHER PUBLICATIONS

Schorr, MA., Straus, EJ., "Formation of Kerf Metallury on Integrated Semiconductor Wafers." Sep. 1, 1972.*
Emsley, John (Aug. 11, 2003). Nature's building blocks: an A-Z guide to the elements. Oxford University Press. pp. 121-125. ISBN 978-0-19-850340-8. http://books.google.com/books?id=j-Xu07p3cKwC&pg=PA123.*

* cited by examiner

*Primary Examiner* — N Drew Richards
*Assistant Examiner* — Christina Sylvia
(74) *Attorney, Agent, or Firm* — Infineon Technologies AG; Philip Schlazer

(57) ABSTRACT

One or more embodiments may include a method of making a semiconductor structure, comprising: forming a first opening partially through a semiconductor substrate; forming a first dielectric layer over a sidewall surface of the first opening; and forming a second opening partially through a semiconductor substrate, the second opening being below the first opening.

20 Claims, 25 Drawing Sheets

METHOD OF PROTECTING SIDEWALL SURFACES OF A SEMICONDUCTOR SUBSTRATE

TECHNICAL FIELD

Embodiments of the present invention relate to semiconductor structures and methods for making semicondcutor structures.

BACKGROUND

In the fabrication process of semiconductor products it may be useful to provent electrical shorts between the metallization and the substrate. New ways of preventing such shorts are needed.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become clear better understood by reference to the following detailed description. The elements of the drawings are not necessarily to scale relative to each other.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
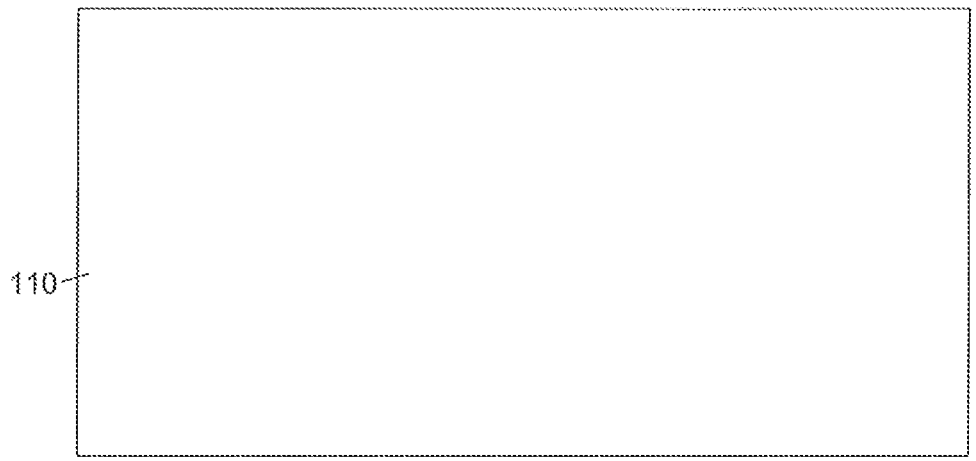
FIGS. 1 through 13C show a method of making a semiconductor structure in accordance with an embodiment.

FIG. 1 shows a substrate 110. The substrate 110 may be a semiconductor substrate. The semiconductor substrate 110 may be a silicon substrate. The substrate may be a bulk semiconductor substrate. A bulk semiconductor substrate may include epitaxial layers or may be formed without epitaxial layers. In one or more embodiments, the substrate 110 may be a silicon substrate. The silicon substate may include monocrystalline silicon (for example, bulk monocrystalline silicon).

The substrate 110 may be a semiconductor-on-insulator substrate (e.g. an SOI substrate), such as a silicon-on-insulator. The substrate 110 may, for example, represent a wafer substrate such as a semiconductor wafer substrate. The semiconductor wafer substrate may be a silicon wafer substrate. The wafer substrate may be a bulk wafer substrate (with or without epitaxial layers) or the wafer substrate may be a semiconductor on insulator wafer substrate such as a silicon-on-insulator wafer substrate.

A wafer substrate may be used as a support to form (for example, with the addition of metallization layers formed over the wafer substrate), a finished semiconductor wafer. A finished semiconductor wafer may be singulated into individual semiconductor chips.

Figure 2:
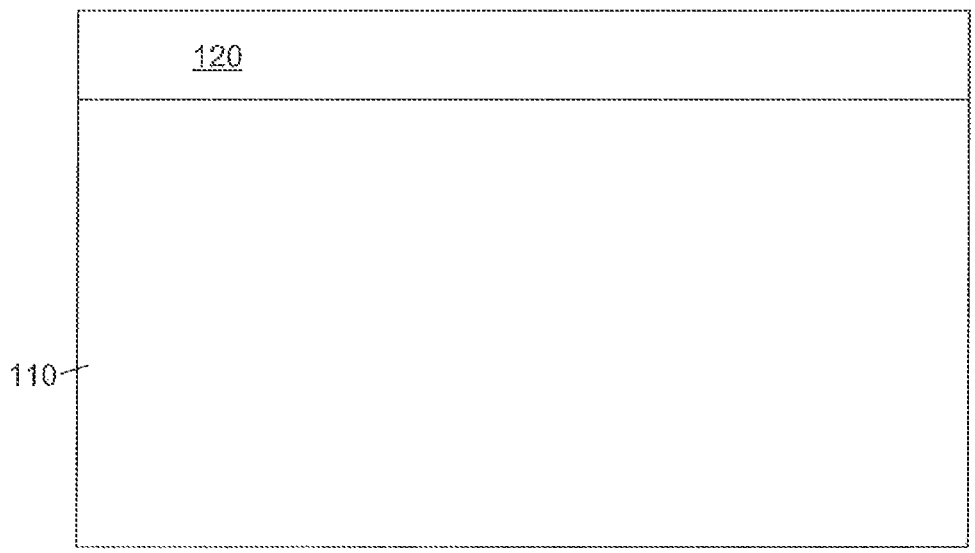

FIG. 2 shows that a masking layer 120 may be formed over the substrate 110. In an embodiment, the masking layer 120 may comprise a dielectric such as an oxide (e.g. silicon dioxide). In an embodiment, the masking layer 120 may, for example, comprise a resist material (e.g. a photoresist material). Hence, in an embodiment, the masking layer 120 may be a resist layer such as a photoresist layer.

Figure 3:
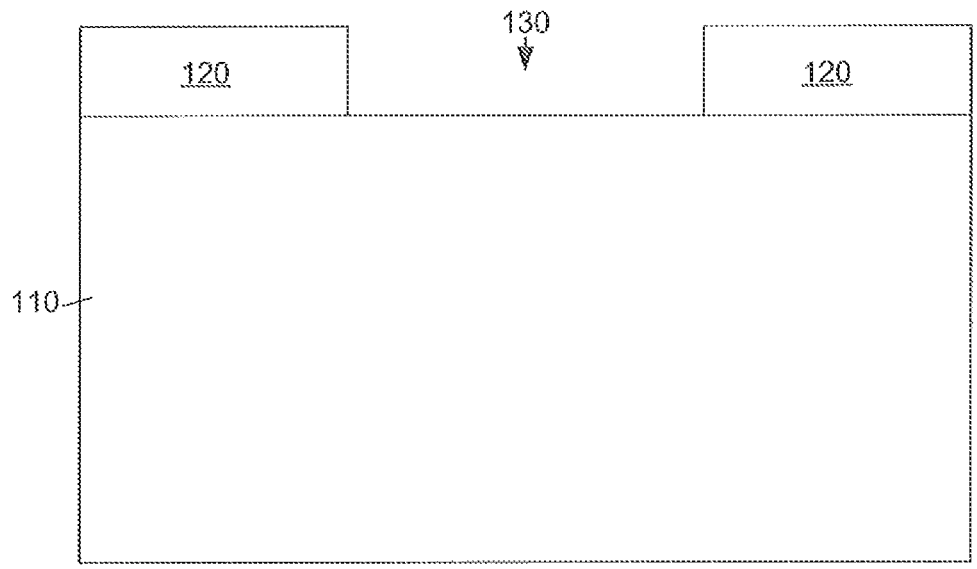
Figure 4:
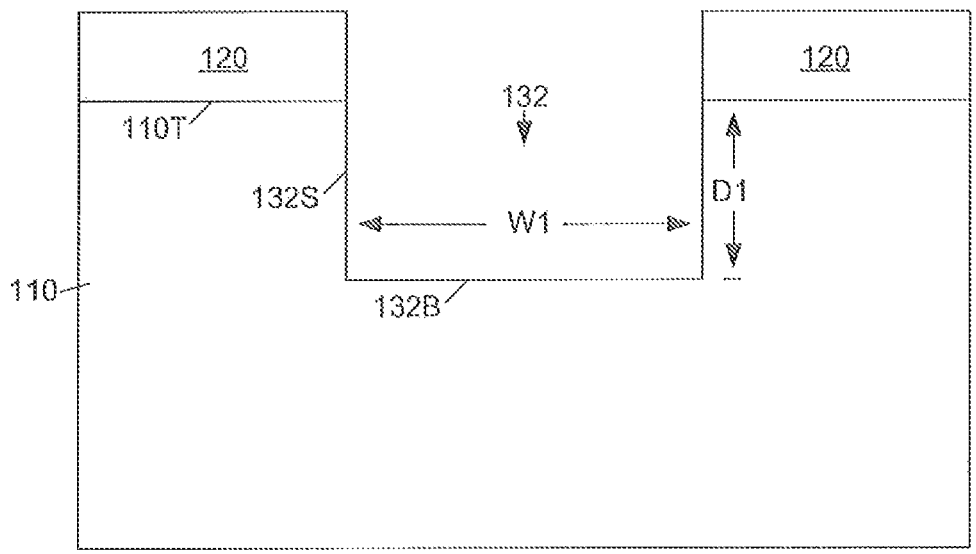

FIG. 3 shows that the masking layer 120 may be patterned to form the patterned masking layer 120 shown in FIG. 4. For example, one or more openings 130 may be formed through the masking layer 120 shown in FIG. 3 to form the patterned masking layer 120 shown in FIG. 4. In one or more embodiments, the opening 130 may be a trench. In one or more embodiments, the opening may be a hole. More than one laterally spaced apart opening 130 may be formed in the masking layer 120. In an embodiment, a plurality of laterally spaced apart openings 130 (for example, trenches 130) may be formed in the masking layer 120. The patterned masking layer 120 shown in FIG. 3 may be referred to as a mask.

FIG. 4 shows that the pattern from the patterned masking layer 120 may be re-created in the substrate 110. For example, an opening 132 (for example, a trench) may be formed within the substrate 110. The opening 132 includes one or more sidewall surfaces 132S as well as a bottom surface 132B. In the embodiment shown, the opening 132 may be formed partially through the substrate 110. In another embodiment, it is possible that the opening 132 be formed totally through the substrate 110. Hence, an opening 132 may be formed at least partially through the substrate 110. In an embodiment, a plurality of laterally spaced apart openings 132 (for example, trenches 132) may be formed in the substrate 110.

Referring to FIG. 4, the openings 132 may have any lateral cross-sectional shape. In one or more embodiments, the openings 132 may be trenches. In one or more embodiments, the openings 132 may be holes. In one or embodiments, the openings 132 may have a depth D1 and a width W1.

Figure 5:
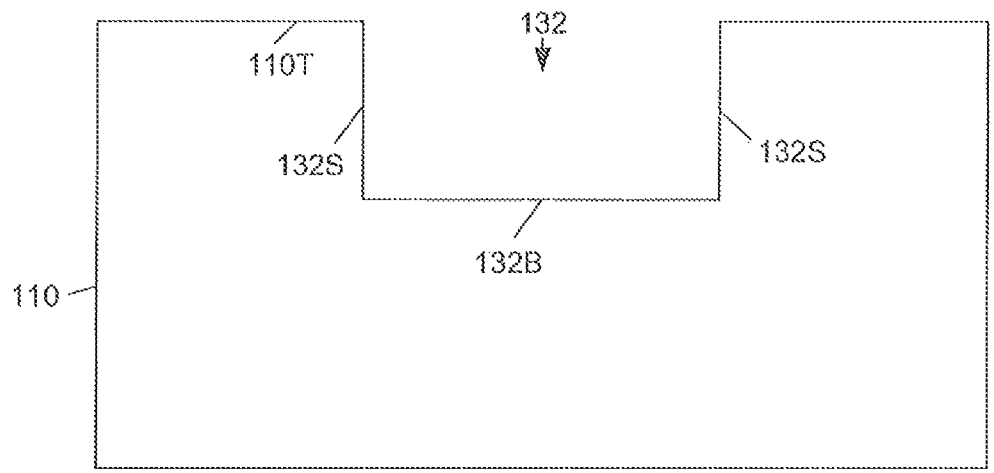

FIG. 5 shows that the patterned masking layer 120 may be removed after the opening 132 is formed.

Figure 6:
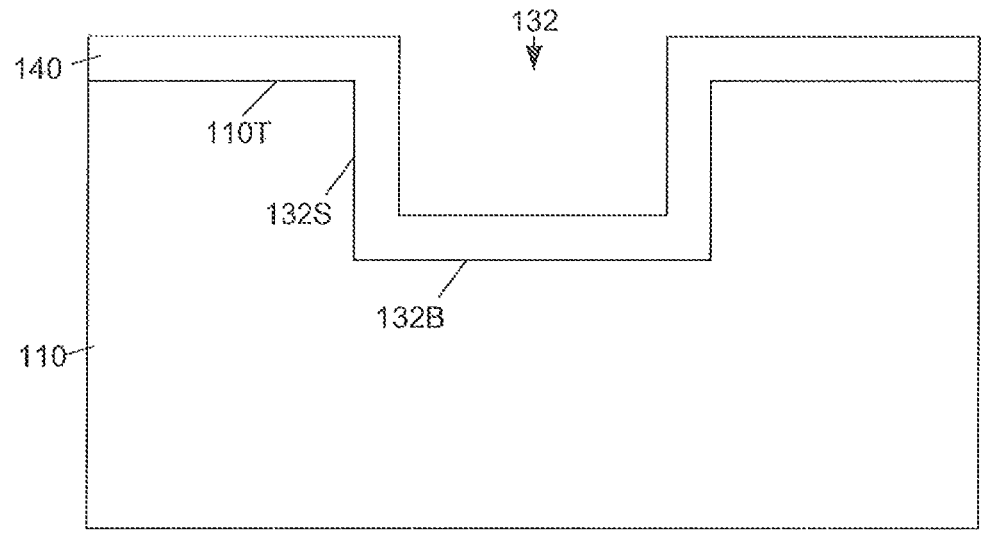

FIG. 6 shows that a dielectric layer 140 may be formed over the substrate 110. The dielectric layer 140 may be formed over the top surface 110T of the substrate 110 as well as the bottom surface 132B and sidewall surfaces 132S of the opening 132 (for example, trench 132). The dielectric layer 140 may be formed by a growth process or by a deposition process such as a conformal deposition process. The dielectric layer 140 may comprise at least one material selected from the group consisting of an oxide, a nitride, and an oxynitride. The dielectric layer 140 may comprise an oxide such as a TEOS oxide. The oxide may be a silicon dioxide that may be formed by a chemical vapor deposition (CVD) process.

Figure 7:
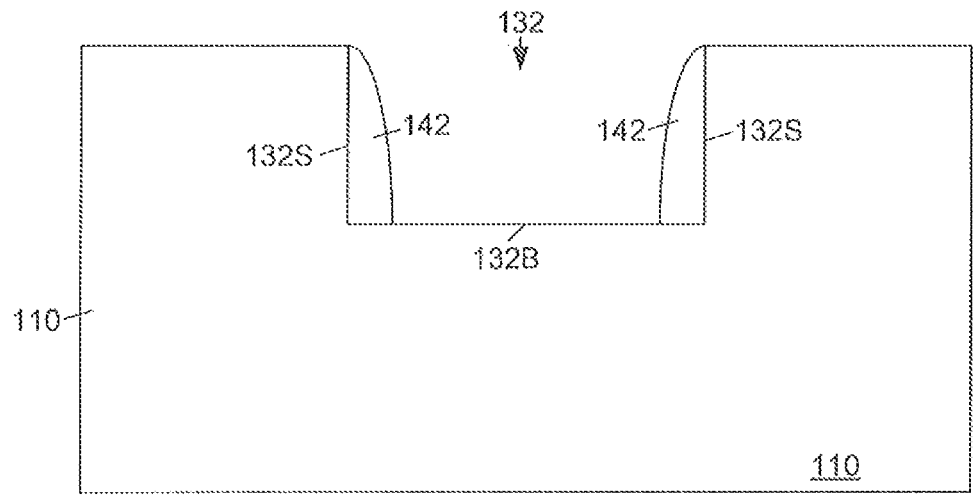

FIG. 7 shows that the dielectric layer 140 may be etched to form one or more sidewall spacers 142. In some embodiments, the one or more sidewall spacers 142 may be a plurality of sidewall spacers 142. The sidewall spacers 142 may be formed by a spacer etch such as by an anisotropic etch of dielectric layer 140.

Figure 8:
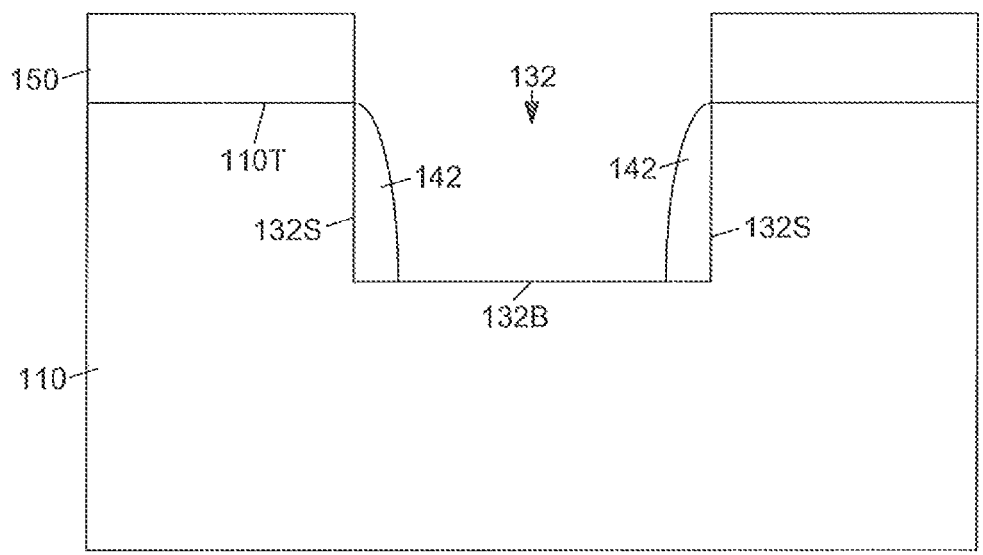

FIG. 8 shows that a mask 150 may be formed over the structure shown in FIG. 7 to form the structure shown in FIG. 8. For example a masking layer may be formed over the structure shown in FIG. 7 and then patterned to form the patterned masking layer or mask 150 shown in FIG. 8. The mask 150 overlies the top surface 110T of the substrate 110. The mask 150 may comprise a resist material such as a photoresist material. The mask 150 may include an organic material.

Figure 9:
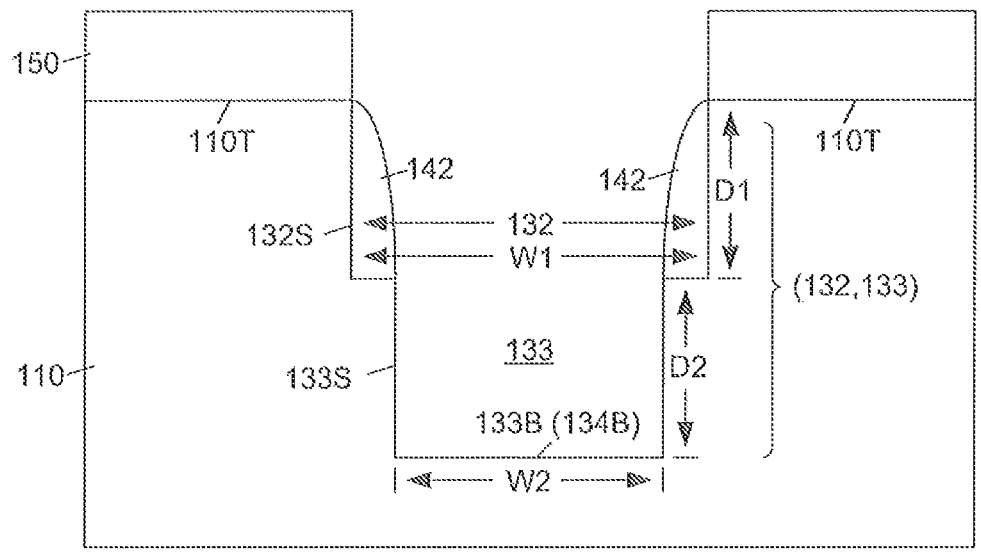

FIG. 9 shows that the mask 150 as well as the sidewall spacers 142 may be used as masks so that an opening 133 may be formed within the substrate 110. In one or more embodiments, the opening 133 may have any lateral cross-sectional shape. In one or more embodiments, the opening 133 may be a trench. In one or more embodiments, the opening 133 may be a hole. In one or more embodiments, the opening 133 may have a depth D2 and a width W2. The opening 133 (for example, a trench) may be formed by an etching process. The etching process may be a plasma etching process. In one or more embodiments, the etching process may include an isotroic etching process. In one or more embodiments, the etching process may include an anisotropic etching process. The etching process may include a Reactive Ion Etching (RIE) process. The etching process may include a Bosch etching process. The etching process may include a cryogenic eching process. The Bosch etching process may include a Deep Reactive Ion Etching (DRIE) process. The DRIE process may include an anisotropic etch process which may be used to create deep penetrations.

In one or more embodiments, the Bosch etching process may include pulsed or time-multiplexed. The Bosch etching process may, for example, include two process modes. The two process modes may alternate back and forth. The first mode may be an etching process such as a plasma etch (for example an isotropic plasma etch). The second mode may be a deposition process such as the deposition of a chemically inert passivation layer. The etching and deposition steps may be repeated many times which may result in a large number of small isotropic etch steps. As a result, in one or more embodiments, it is possible that substantially vertical sidewalls may be achieved.

In the embodiment shown, the opening 133 may go partially through the substrate 110. In another embodiment, it is possible that the opening 133 may go all the way through the substrate 110.

As a result of forming the opening 133, an opening (132, 133) may also be formed. The opening (132,133) may be viewed as a dual-tier opening comprising an upper portion 132 which is the opening 132 (shown more clearly in FIG. 5 and repeated in FIG. 9) as well as a lower portion 133 which is the opening 133. As noted above, the opening 132 may be a trench so that the upper portion 132 of opening (132,133) may be a trench. The lower portion 133 of opening (132,133) is the opening 133. As noted, the opening 133 may be a trench so that the lower portion 133 of opening (132,133) may be a trench.

It is understood that at least one opening (132,133) may be formed in the substrate 110. In some embodiments, a plurality of openings (132,133) may be formed. In one or more embodiments, the opening (132,133) may be formed in the kerf region of the substrate 110 (e.g. in the kerf region of a wafer substratre).

Referring to FIG. 9, it is seen that the sidewall surfaces 132S of the upper portion 132 (the opening 132) are covered with the dielectric sidewall spacers 142. On the other hand, the sidewall surfaces 133S of the lower portion 133 (the opening 133) are still exposed.

Referring to FIG. 9, a first ratio RATIO1 may be defined as RATIO1=D1/(D1+D2). In one or more embodiments, RATIO1 may be less than or equal to 0.9. In one or more embodiments, RATIO1 may be less than or equal to 0.8. In one or more embodiments, RATIO1 may be less than or equal to 0.7. In one or more embodiments, RATIO1 may be less than or equal to 0.6. In one or more embodiments, RATIO1 may be less than or equal to 0.5. In one or more embodiments, RATIO1 may be less than or equal to 0.4. In one or more embodiments, RATIO1 may be less than or equal to 0.3. In one or more embodiments, RATIO1 may be less than or equal to 0.2. In one or more embodiments, RATIO1 may be greater than or equal to 0.1. In one or more embodiments, RATIO1 may be greater than or equal to 0.2. In one or more embodiments, RATIO1 may be greater than or equal to 0.3.

Referring to FIG. 9, a ratio RATIO2 may be defined as RATIO2=W2/W1. In one or more embodiments, RATIO2 may be greater than or equal to 0.1 but less than or equal to 0.9. In one or more embodiments, examples of possible RATIO2 values include 0.2, 0.3, 0.4, 0.5, 0.6, 0.7 and 0.8.

Referring to FIG. 9, a ratio RATIO3 may be defined as RATIO3=D1/W2. In one or more embodiments, RATIO3 may be greater than or equal to 1. In one or more embodiments, RATIO3 may be greater than or equal to 2. In one or more embodiments, RATIO3 may be greater than or equal to 5. In one or more embodiments, RATIO3 may be greater than or equal to 10. In one or more embodiments, RATIO3 may be greater than or equal to 20. In one or more embodiments, RATIO3 may be greater than or equal to 50. In one or more embodiments, RATIO3 may be greater than or equal to 100.

Figure 10:
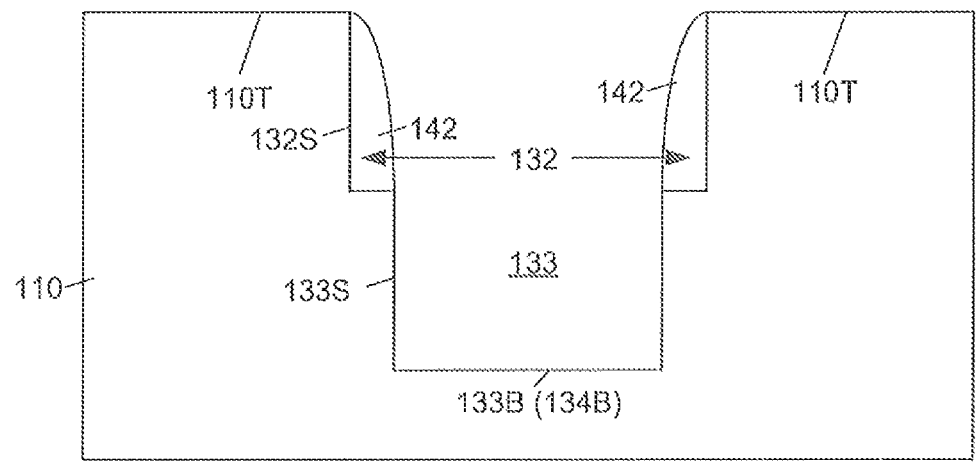

FIG. 10 shows that the mask 150 may be removed after the opening 133 is formed.

Figure 11:
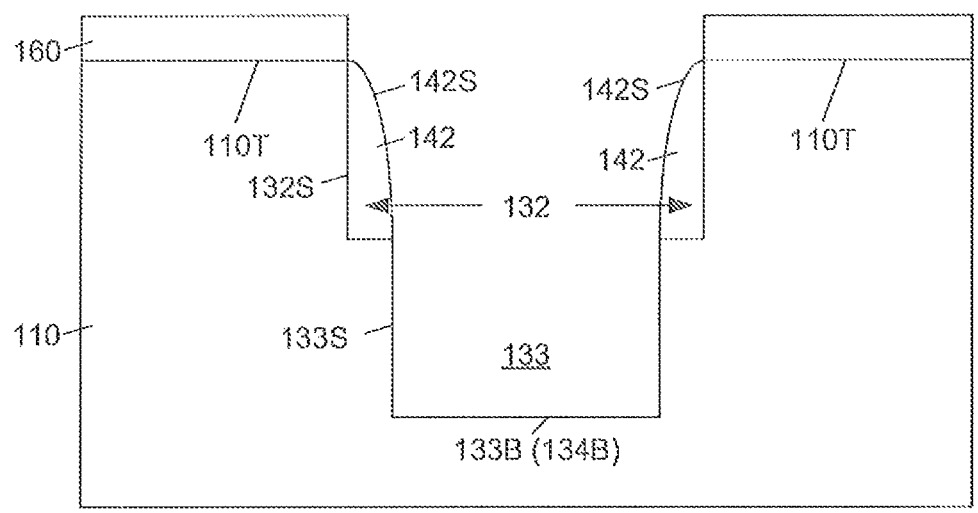

FIG. 11 shows that a dielectric layer 160 may be formed over the top surface 110T of the substrate 110. The dielectric layer 160 may remain over the top surface 110T of the substrate 110. The dielectric layer 160 may comprise one or more materials selected from the group consisting of an oxide, a nitride, and an oxynitride. In one or more embodiments, the dielectric layer 160 may comprise silicon dioxide. The dielectric layer 160 may serve as an interlevel dielectric layer between the substrate and a first metallization level (e.g. Metal 1). It is noted that a semiconductor chip may have one or more metallization levels from Metal-1, Metal-2, Metal-3 all the way to the final metallization level Metal-F.

In the embodiment shown in FIG. 11, the dielectric layer 160 is shown over the top surface 110T of the substrate 110. In one or more embodiments, it is possible that a portion of the dielectric layer 160 falls over onto the sidewall surfaces 142S of the sidewall spacers 142. In one or more embodiments, it is also possible that a dielectric material be disposed over the structure shown in FIG. 10 and then patterned to form the dielectric layer 160 as shown in FIG. 11.

Figure 12A:
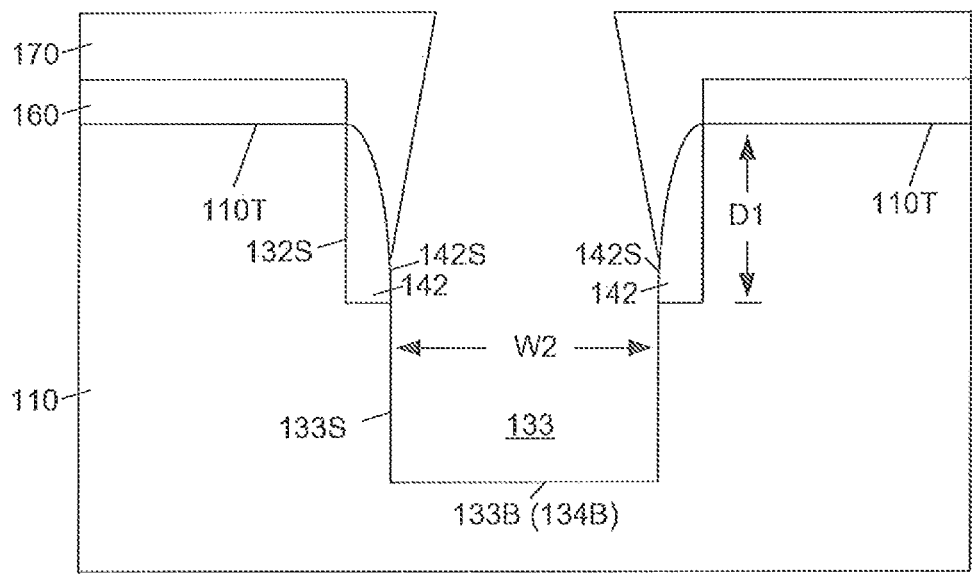

FIG. 12A shows that a conductive layer 170 may be formed over the structure of FIG. 11 to form the structure shown in FIG. 12A. Referring to FIG. 12A, it is seen that the conductive layer 170 may be formed over the top surface of the dielectric layer 160. Also, it is seen that the conductive layer 170 may additionally be formed over at least a portion of each of the sidewall surfaces 142S of the one or more dielectric sidewall spacers 142. The formation of the conductive layer 170 may include a deposition process. The deposition process may include a physical vapor deposition (PVD) process.

It is also seen that, in one or more embodiments, the conductive layer 170 is not formed over the sidewall surfaces 133S of the opening 133.

Hence, in the embodiment shown in FIG. 12A the conductive layer 170 is not in direct physical contact or in direct electrical contact with the sidewall surfaces 133S of the opening 133 (which correspond to the sidewall surfaces 133S of the substrate 110). In the embodiment shown in FIG. 12A, the conductive layer 170 is not in electrical contact with the sidewall surfaces 133 of the substrate. Hence, there may be no electrical coupling between the conductive layer 170 and the substrate 110 by way of the sidewall surface 133S. Hence, in one or more embodiments, there may be no electrical shorts between the conductive layer 170 and the sidewall surfaces 133.

Referring to FIG. 12A, the conductive layer 170 may be formed so as to cover only an upper portion (or a top portion) of the sidewall surface 142S of the sidewall spacer 142. A lower portion (or a bottom portion) of the sidewall surface 142S may remain free of the conductive layer 170. In another embodiment, the conductive layer 170 may cover substantially all (or all) of the sidewall surface 142S of the sidewall spacer 142.

In one or more embodiments, the conductive layer 133S may be formed so that it does not directly contact the sidewall surface 133S. Hence, in one or more embodiments, when the conductive layer 170 is formed, it may be formed on all or a portion of the sidewall surfaces 142S but may not be formed on the sidewall surfaces 133S. In addition, it may not form on the bottom surface 133B of the opening 133. For example, the formation process may include a deposition process (such as a physical vapor deposition process). The dimensions of the opening 132 (for example, depth and/or width) and/or the dimensions of the opening 133 (for example, depth and/or width) may be chosen so that the conductive layer 170 does not form on the sidewall surfaces 133S and/or on the bottom surface 133B of the opening 133.

In an embodiment, the conductive layer 170 may comprise any conductive conductive material. In one or more embodiments, the conductive material may comprise a metallic material. The metallic material may, for example, be a pure metal, an alloy or a compound. It is understood that a pure metal may include some amount of trace impurities. It is also understood that an alloy may include a first metallic element and a second metallic element. An alloy may also include a first metallic element and a non-metallic element (such as steel). As examples, the conductive layer 170 may comprise one or more materials selected from the group consisting of pure copper, copper alloy, pure aluminum, aluminum alloy, pure silver, silver alloy, pure gold, and gold alloy.

The conductive layer 170 may represent a metallization level (or metallization layer) of a semiconductor device. The metallization level may be the first metallization level (e.g. Metal 1) or some other metallization level (such as Metal 2, Metal 3, etc).

The conductive layer 170 may be formed by a deposition process. In one or more embodiments, the deposition process may be a non-conformal deposition process. In one or more embodiments, the deposition process may be a physical vapor deposition (PVD) process. In one or more embodiments, the physical vapor deposition process may be a blanket process. In one or more embodiments, it is possible that the deposition process include a conformal deposition process.

Referring to FIG. 12A, it is seen that, in one or more embodiments, it is possible that the sidewall spacers 142 may prevent the conductive material of conductive layer 170 from reaching the sidewalls 132S of the opening 132. In addition, the conductive material of the conductive layer 170 may not be able to reach the sidewall surfaces 133S of the opening 133. This may be at least partially due to the dimensions (for example, the depth and width) of the openings 132 and 133. In addition, the conductive material of the conductive layer 170 may not be able to reach the bottom surface 133B of the opening 133.

Hence, in one or more embodiments, the conductive layer 170 may deposit onto the sidewall surfaces 142S of the sidewall spacers 142. The conductive layer 170 layer may not deposit onto the sidewall surfaces 133S of the openings 133. In addition, the conductive layer 170 may not deposit onto the bottom surface 133B of the opening 133.

In one or more embodiments, there may be a lower portion of the sidewall surfaces 142S of the sidewall spacers 142 where the conductive layer 170 is not formed (for example, not deposited).

Figure 12B:
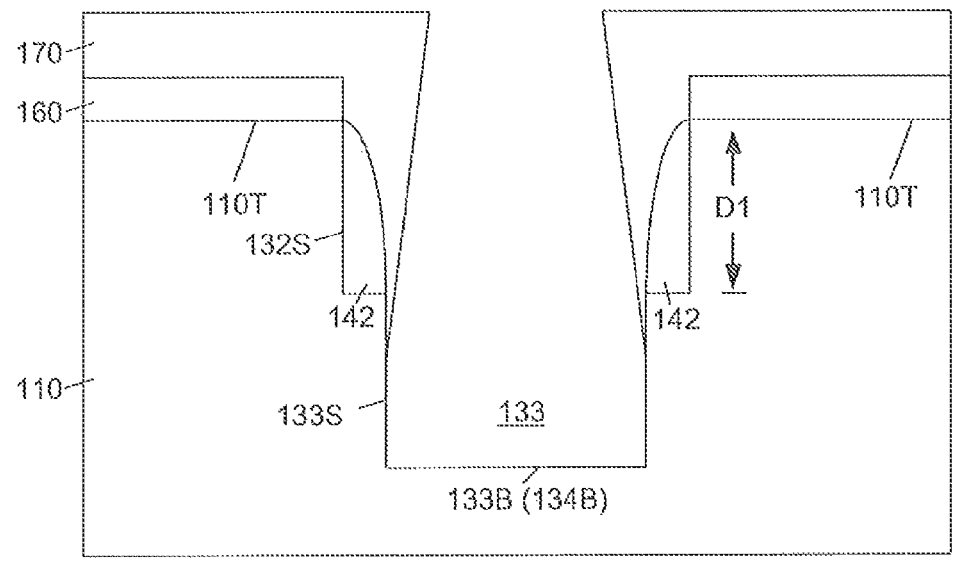
Figure 12C:
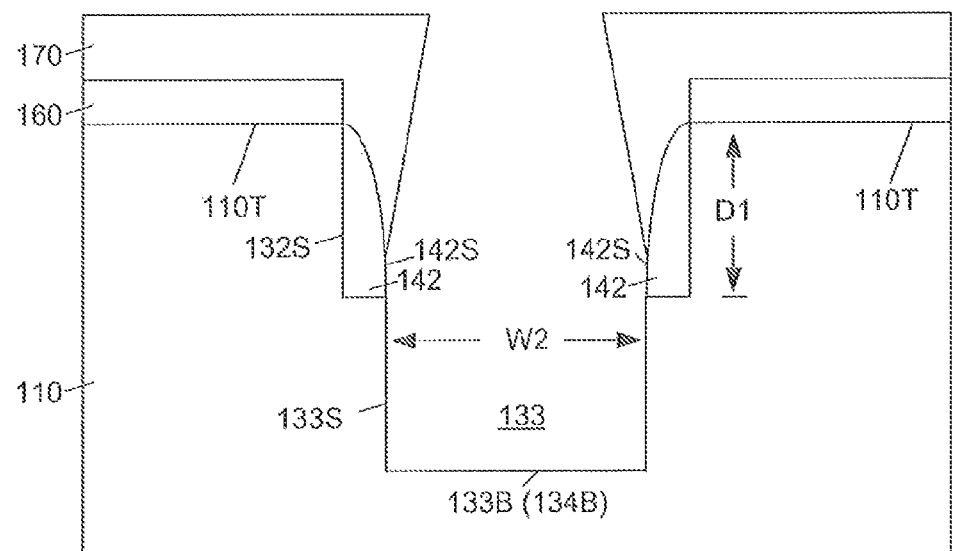

Referring to FIG. 12B, in one or more embodiments, it one or more embodiments, it is instead possible that the conductive layer 170 is formed so that a portion of it also forms on the sidewall surface 133S and/or on the bottom surface 133B. Referring to FIG. 12C, it may then be removed from the surfaces of the opening 133. This removal process may be accomplished by a etching process such as by an etching process.

Figure 12D:
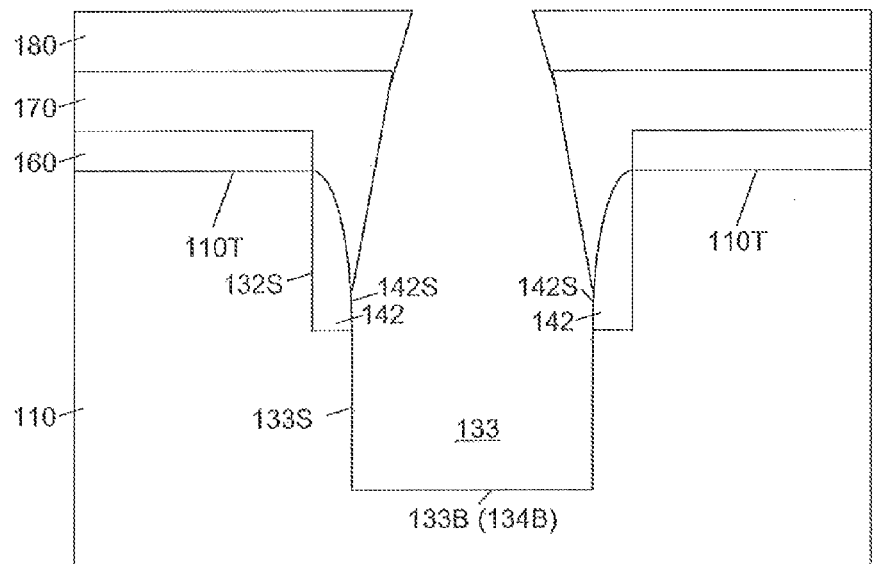

After formation of the conductive layer 170, one or more additional layers may be formed over the structure shown in FIG. 12A (or FIG. 12C) to form the structure shown in FIG. 12D. The one or more additional layers are represented as the layer 180 shown in FIG. 12D. The layer 180 may, for example, include one or more dielectric layers and/or one or more conductive layers. Hence, one or more additional dielectric layers and/or one or more metallization levels may be added to the structure shown in FIG. 12A (or FIG. 12C) so as to form the structure shown in FIG. 12D including one or more metallization levels (for example, a plurality of metallization levels). The structure shown in FIG. 12D may, for example, represent a finished wafer. Referring to FIG. 12B, it is seen that, in one or more embodiments, the layer 180 may not directly contact the sidewalls 133S of the substrate 110. In one or more embodiments, the one or more additional layers represented by layer 180 may not directly contact the sidewalls 133S of the substrate 110.

Figure 13A:
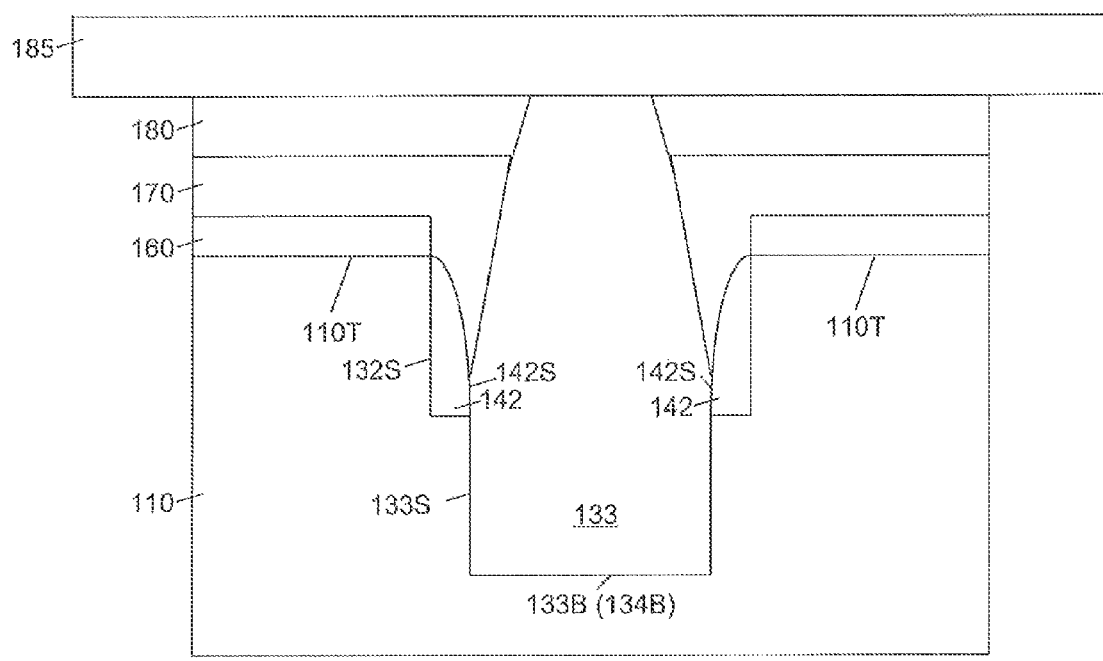
Figure 13B:
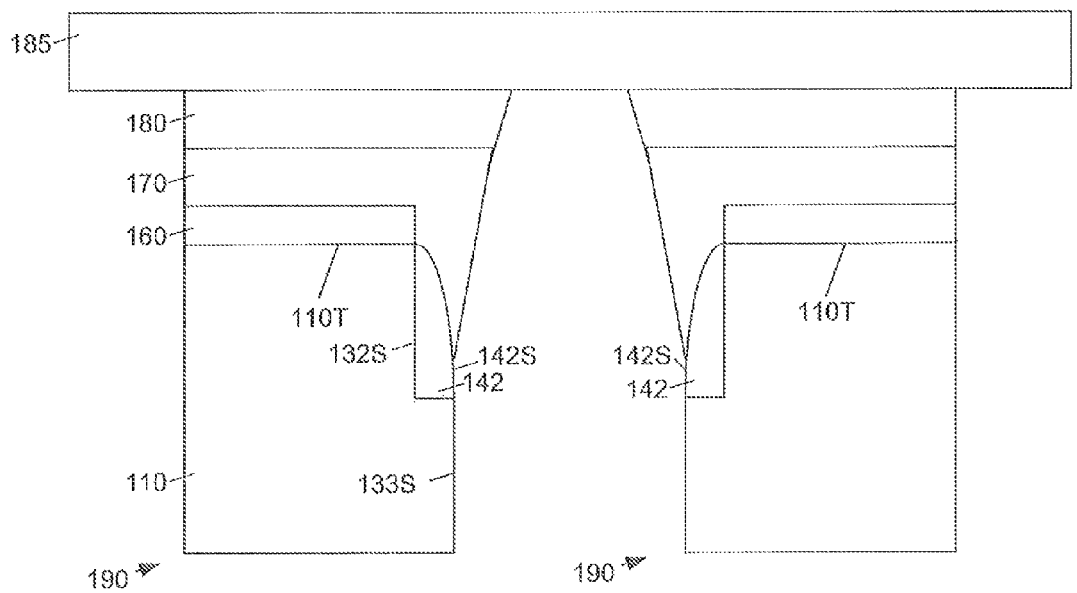
Figure 13C:
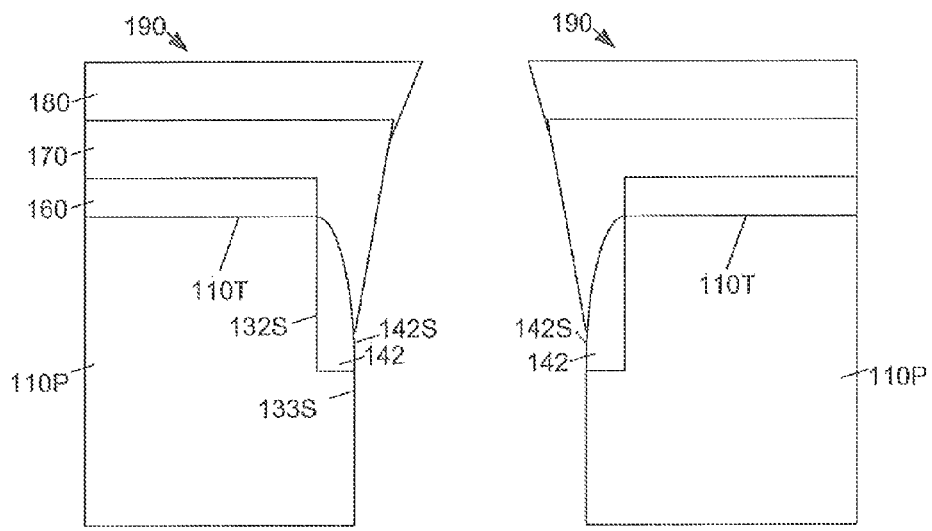

Referring to FIG. 13A, in one or more embodiments, the structure shown in FIG. 12D may be attached to a carrier 185 (for example a carrier substrate or carrier wafer). In one or more embodiments, the structure shown in FIG. 12D may, for example, represent a finished wafer and the front side (e.g. device side) of the finished wafer may be attached to a carrier 185. Referring to FIG. 13B, the finished wafer may be thinned from the back side. The thinning may be accomplished in many ways such as by mechanical grinding or by spin etching. As shown in FIG. 13B, the thinning may separate (e.g. singulate) the structure shown in FIG. 12B into a plurality of parts 190. As noted, the structure shown in FIG. 12B may be a finished wafer so that each of the parts 190 may represent a semiconductor chip 190. As an example, the substrate 110 may be a wafer substrate which may be separated into a plurality of chip substrates 110P. Referring to FIG. 13C, it is seen that each of the semiconductor chips 190 may be removed from the carrier 190.

Referring again to FIG. 12D, it is seen that the substrate 110 may represent a wafer substrate. In one or more embodiments, the opening (132,133) may be in a corresponding kerf region of the wafer substrate. The openings (132,133) may be used to singulate the wafer substrate into individual chip substrates. Likewise, the openings (132,133) may be used to singulate a finished wafer into individual chip substrates.

FIGS. 14 through 31C shows a process of making a semiconductor structure in accordance with one or more embodiments.

Figure 14:
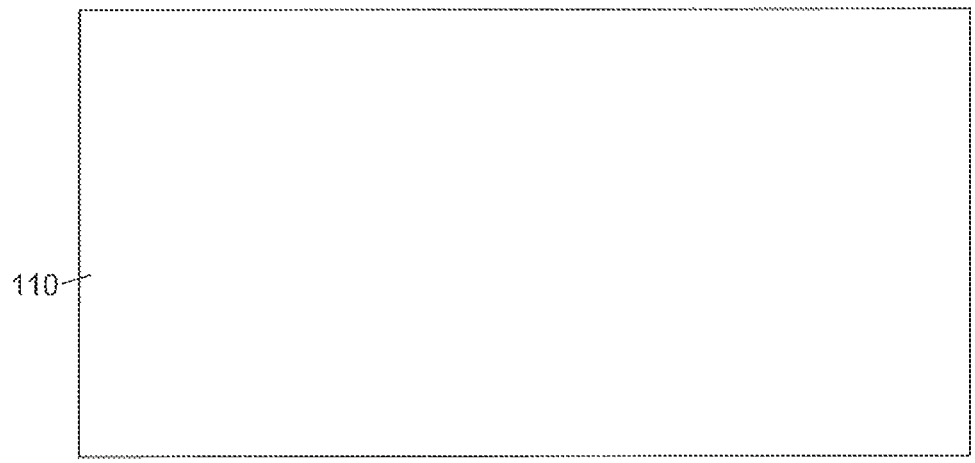
FIGS. 14 through 31C show a method of making a semiconductor structure in accordance with an embodiment.

FIG. 14 shows a substrate 110. The substrate 110 has been discussed above and the discussion is applicable here as well.

Figure 15:
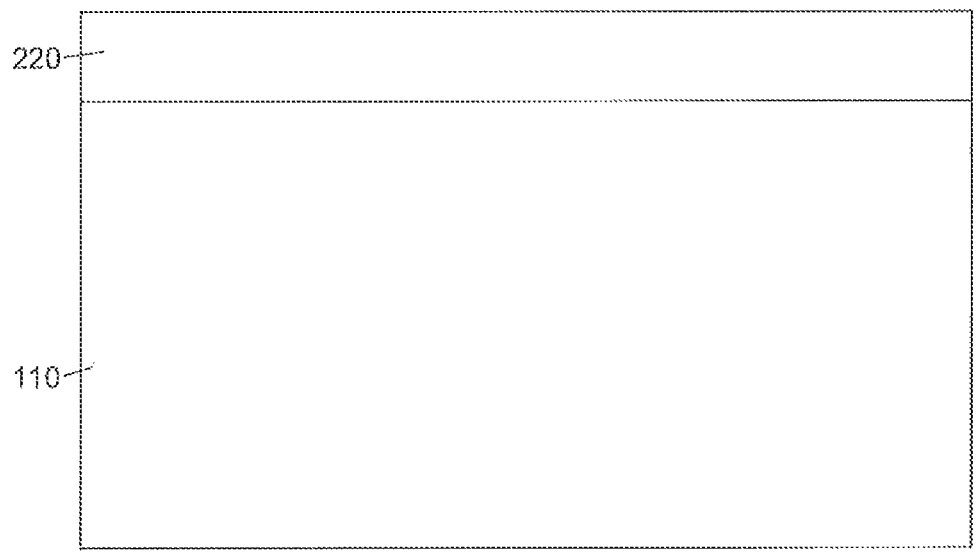

FIG. 15 shows that a masking layer 220 may be formed over the substrate 110. In an embodiment, the masking layer 220 may comprise a dielectric such as an oxide (e.g. silicon dioxide). In an embodiment, the masking layer 220 may, for example, comprise a resist material (e.g. a photoresist material). Hence, in an embodiment, the masking layer 220 may be a resist layer such as a photoresist layer.

Figure 16:
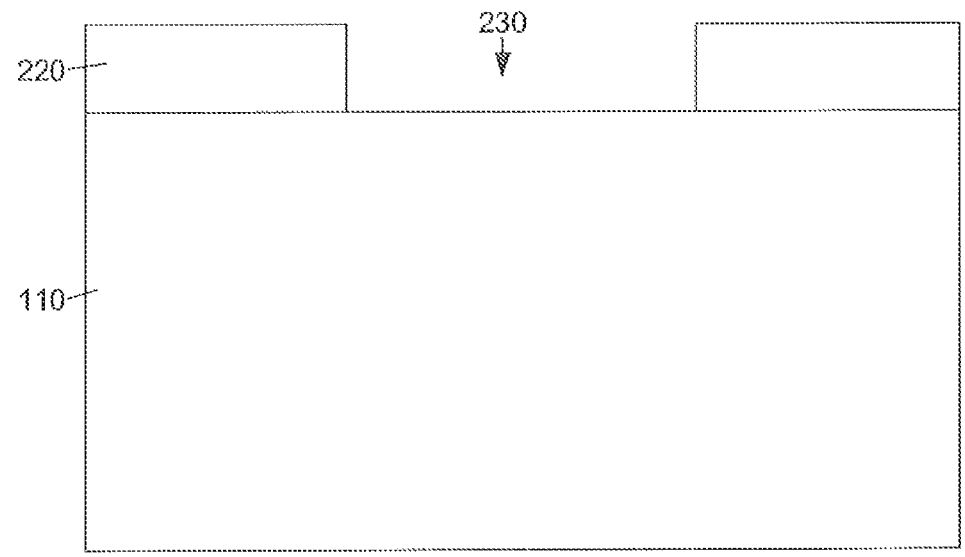

FIG. 16 shows that the masking layer 220 shown in FIG. 15 may be patterned to form the patterned masking layer 220 shown in FIG. 16. The patterned masking layer 220 shown in FIG. 15 is an example of a mask. For example, an opening 230 may be formed through the masking layer 220. In one or more embodiments, the opening 230 may be a trench. In one or more embodiments, the opening may be a hole. In one or more embodiments, more than one laterally spaced apart opening 230 (e.g. trench) may be formed in the masking layer 220. In one or more embodiments, a plurality of laterally spaced apart openings 230 (e.g. trenches) may be formed in the masking layer.

Figure 17:
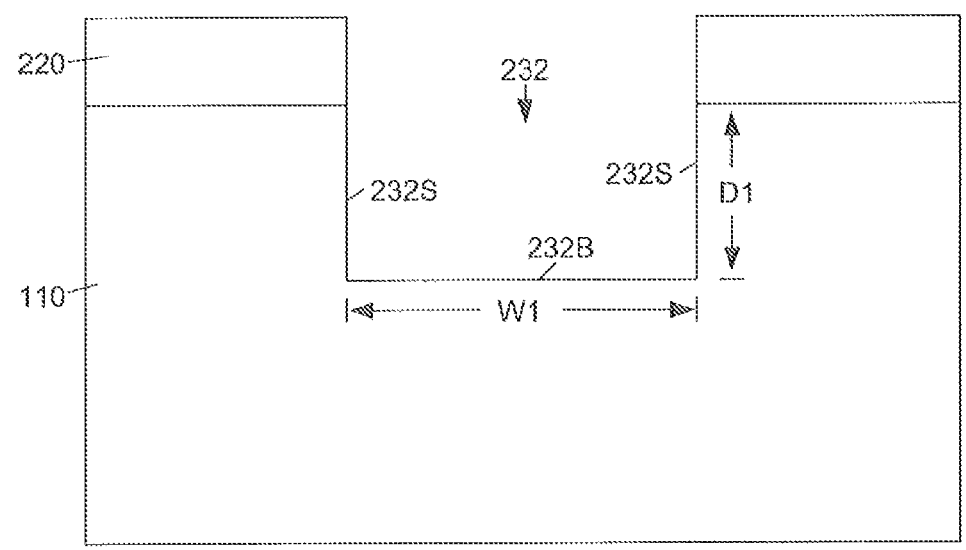

FIG. 17 shows that the pattern from the patterned masking layer 220 may be transferred to the substrate 110. For example, an opening 232 (which may, for example be a trench or a hole) may be formed within the substrate 110. The opening 232 may be formed partially through the substrate 110. In another embodiment, the opening 232 may be formed fully through the substrate 220. Hence, the opening 232 may be formed at least partially through the substrate 110. The opening 232 includes one or more sidewall surfaces 232S as well as a bottom surface 232B. In one or more embodiments, a plurality of laterally spaced apart openings 232 may be formed in the substrate 110. In one or more embodiments, the openings 232 may have any cross-sectional shape. In one or more embodiments, the openings 232 may be trenches. In one or more embodiments, the openings 232 may be holes. The openings 232 (for example, trenches 232) may represent kerf lines in the substrate 110. The kerf lines may later be used to singulate the substrate 110 into multiple parts. In one or more embodiments, the substrate 110 may represent a wafer substrate. The wafer substrate may be singulated into a plurality of chip substrates. Likewise, a finished wafer may be singulated into a plurality of semiconductor chips.

Referring to FIG. 17, in one or more embodiments, the opening 232 may have a depth D1 and a width W1.

Figure 18:
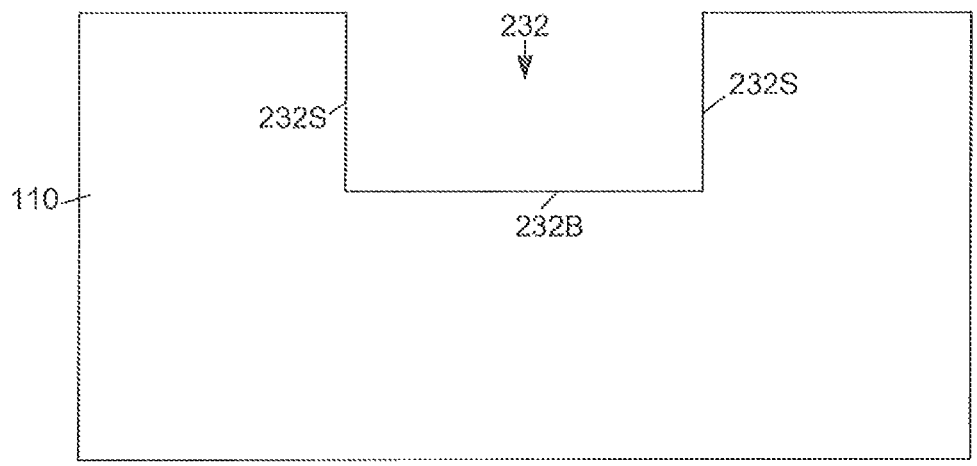

FIG. 18 shows that the patterned masking layer 220 may be removed after the opening 232 is formed.

Figure 19:
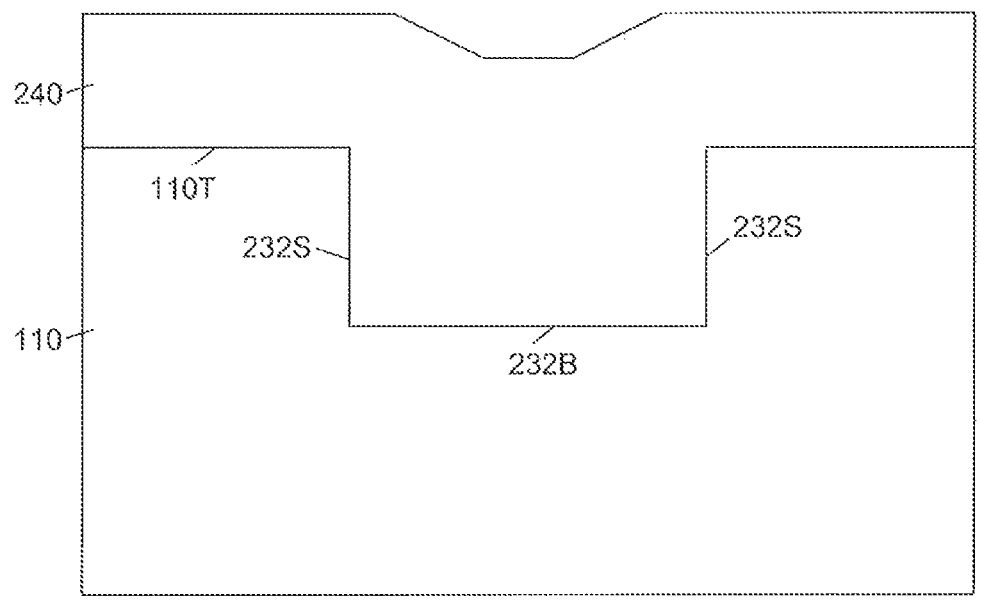

FIG. 19 shows that a dielectric layer 240 may be formed over the substrate 110. In one or more embodiments, the dielectric layer 240 may be formed in the opening 232. The dielectric layer 240 may be formed over the top surface 110T of the substrate 110 as well as the bottom surface 232B and sidewall surfaces 232S of the opening 232 (for example, trench 232). In one or more embodiments, the dielectric layer 240 may fill the opening 232. In one or more embodiments, the opening 232 may be overfilled with the dielectric layer 240. The dielectric layer 240 may be formed by a growth process or by a deposition process such as a conformal deposition process. The dielectric layer 240 may comprise at least one material selected from the group consisting of an oxide, a nitride, and an oxynitride. The dielectric layer 240 may comprise an oxide. In one or more embodiments, the oxide may include a TEOS oxide. In one or more embodiments, the oxide may include a silicon dioxide. The silicon dioxide may be formed by a chemical vapor deposition (CVD) process. In one or more embodiments, the dielectric layer 240 may be formed by a deposition process such as a chemical vapor deposition.

Figure 20:
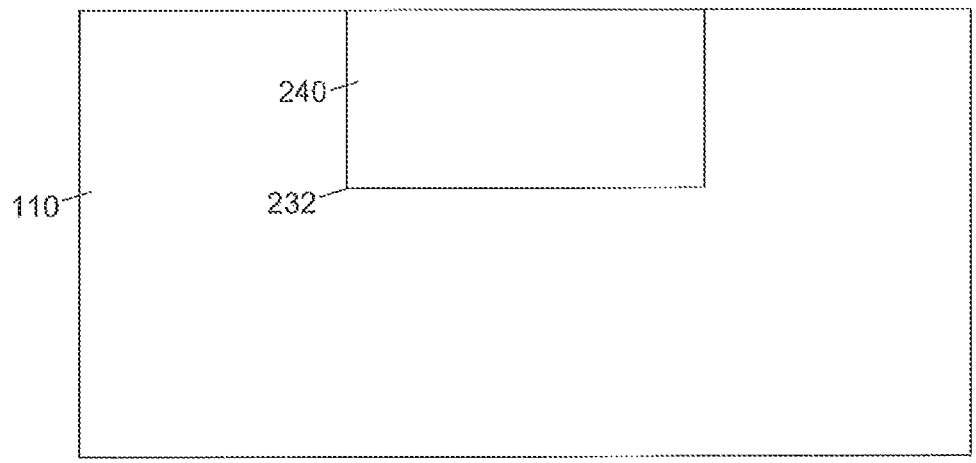

FIG. 20 shows that the dielectric layer 240 may be planarized to remove that portion overlying the top surface 110T of the substrate 110. The portion remaining is that portion within the opening 232 (for example, trench 232).

Figure 21:
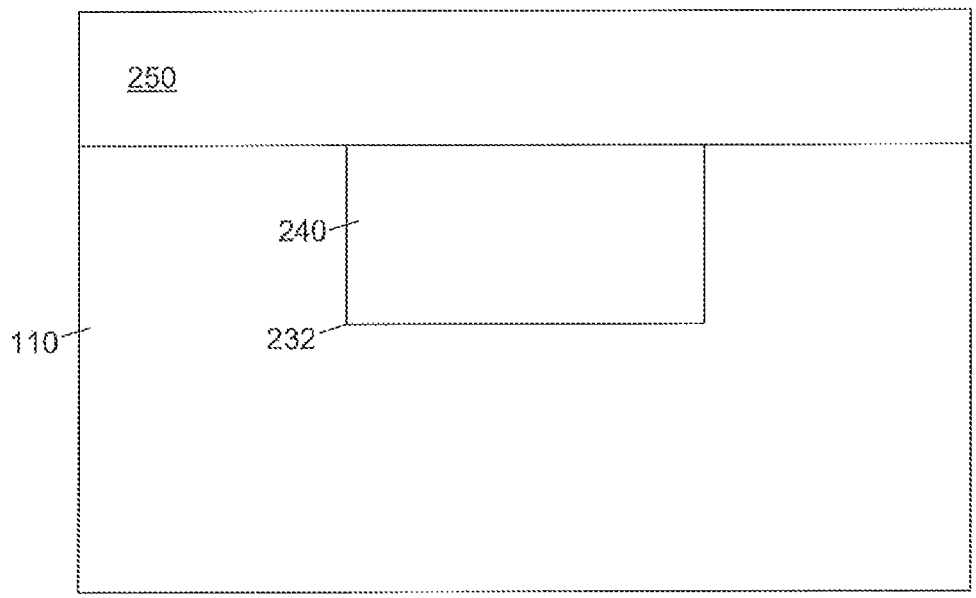

FIG. 21 shows that a masking layer 250 may be formed over the substrate 110. In one or more embodiments, the masking layer 250 may comprise a resist material such as a photoresist material.

Figure 22:
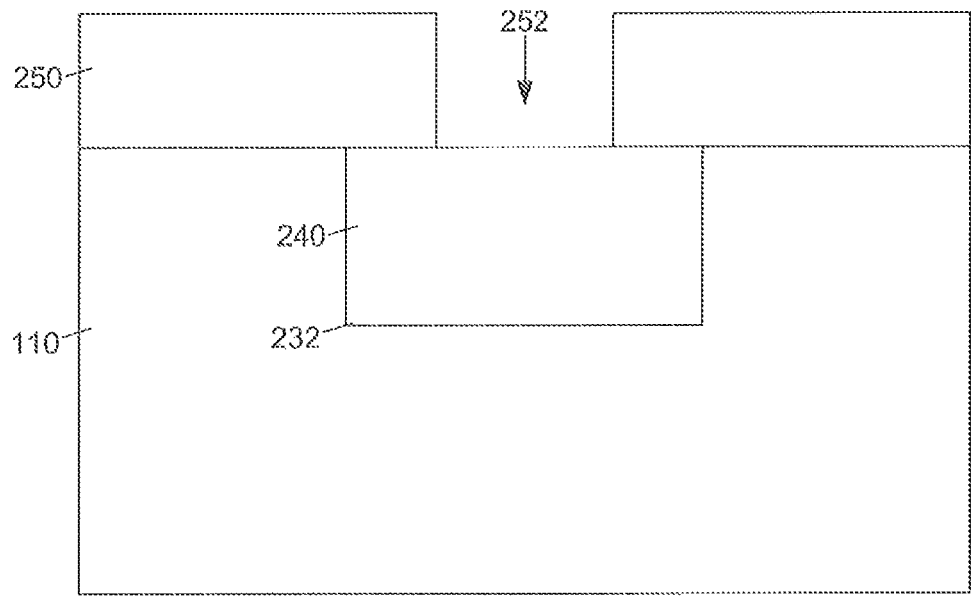

FIG. 22 shows that the masking layer 250 from FIG. 21 may be patterned to form the patterned masking layer 250 shown in FIG. 22. The patterned masking layer 250 is an example of a mask. An opening 252 may be formed through the masking layer 250. The opening 252 may, for example, be a trench or a hole. The opening 252 may be formed so as to overlie dielectric layer 240. The patterned masking layer 250 may comprise a plurality of spaced apart openings 252 (for example, a plurality of spaced apart trenches). Each of the spaced apart openings 252 may be formed over a dielectric layer 240.

Figure 23:
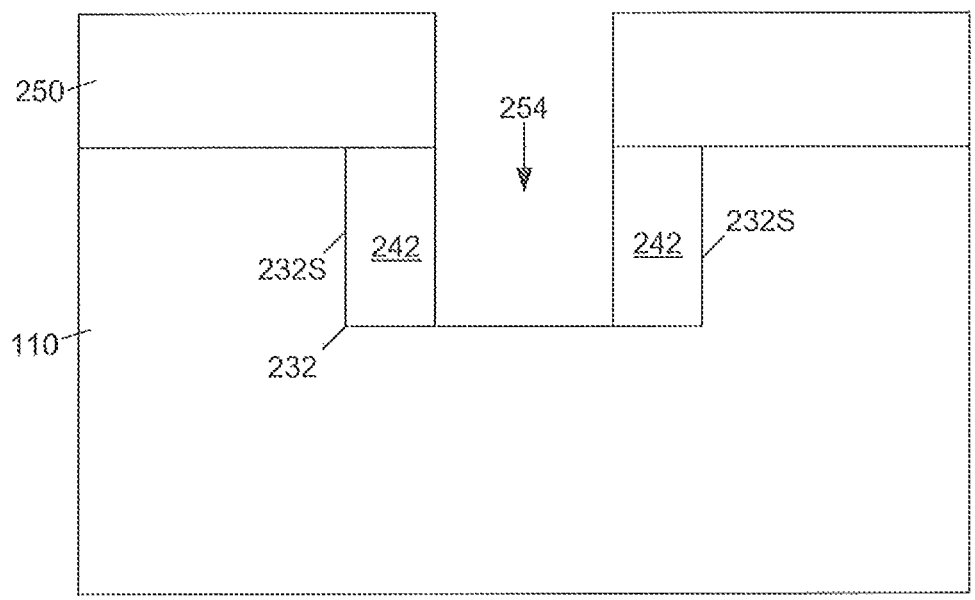

FIG. 23 shows that the patterned masking layer 250 may be used as a mask to pattern the dielectric layer 240 of FIG. 22. In the embodiment shown in FIG. 23, the dielectric layer 240 of FIG. 22 may be etched to form the opening 254 through the dielectric layer 240. In one or more embodiments, the opening 254 may be a trench. The trench 254 may separate the dielectric layer 240 into two portions 242 which are spaced apart from each other. Each of the portions 242 is a dielectric layer 242 which may be in the form of a dielectric block 242. Each dielectric layer 242 may be proximate (for example, close to or in contact with) a respective sidewall surface 232S of the opening 232.

Figure 24:
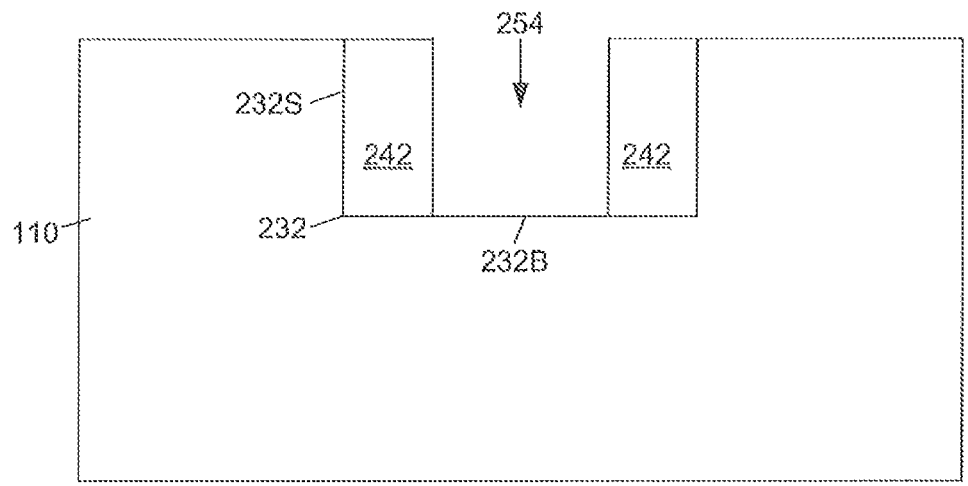

FIG. 24 shows that the masking layer 250 may then be removed.

Figure 25:
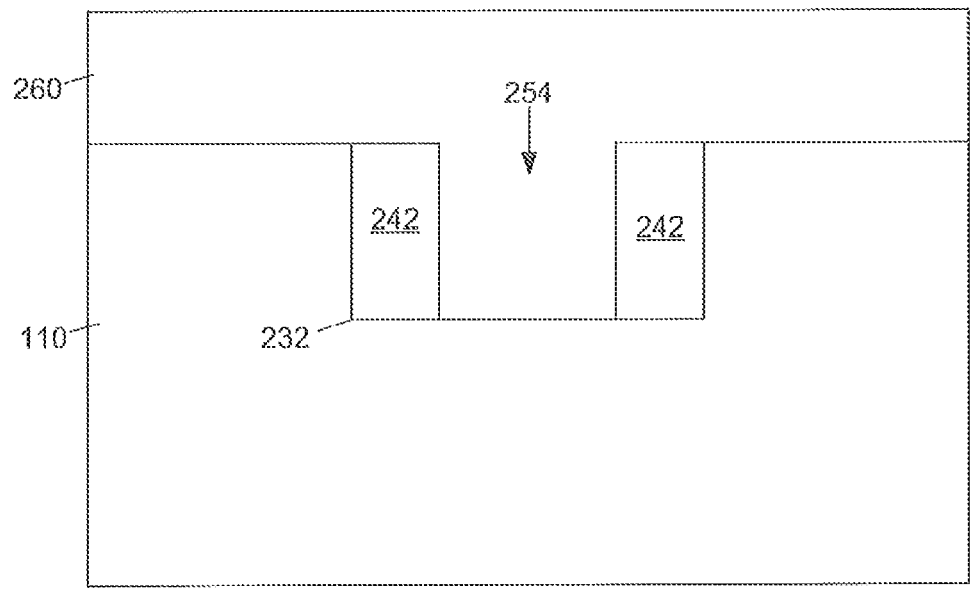

FIG. 25 shows that a masking layer 260 may be formed over the structure from FIG. 24. For example, the masking layer 260 may be formed over the top surface of the substrate 110 as well as the top surface of the dielectric layers 242 as well as within the opening 254. The masking layer 260 may fill the opening 254. The masking layer 260 may comprise a resist material (e.g. a photoresist material). The masking layer 260 may comprise an organic material. The masking layer 260 may be one suitable for a plasma etching process. The masking layer 260 may be one suitable for partial plasma dicing process. In one or more embodiments, the masking layer 260 may be one suitable for partial dicing before grinding.

Figure 26:
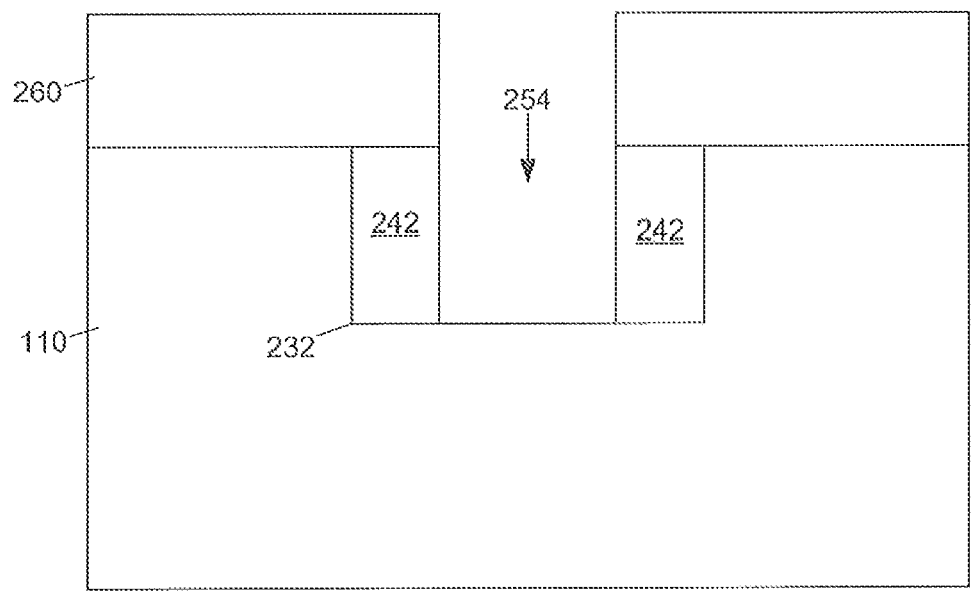

FIG. 26 shows that the masking layer 260 shown in FIG. 25 may be patterned to form the patterned masking layer 260 shown in FIG. 26. The patterned masking layer 260 provides an example of a mask. it is seen that the masking layer 260 is patterned so as to remove the masking layer 260 from the opening 254 (for example, trench 254). Hence, the patterned masking layer 260 may remain over the top surface of the substrate 110 and may also remain over the top surfaces of the dielectric layers 242.

Figure 27:
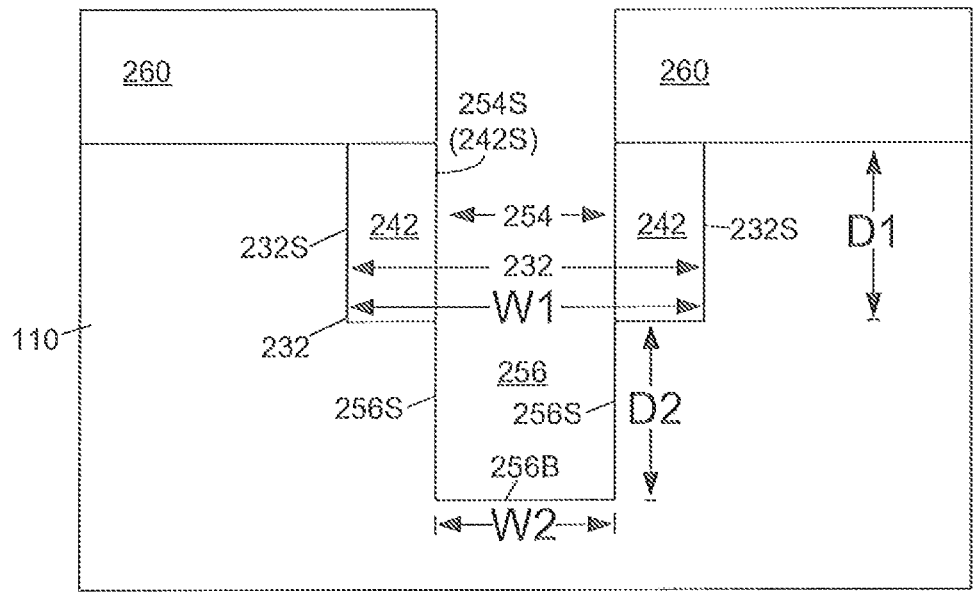

Referring to FIG. 27, it is seen that the patterned masking layer 260 may be used as a mask to form the opening 256 within the substrate 110. In one or more embodiments, it is also possible that the dielectric blocks 242 also be used as masks. In one or more embodiments, the opening 256 may have any lateral cross-sectional shape. In one or more embodiments, the opening 256 may be a trench. In one or more embodiments, the opening 256 may be a hole. The opening 256 may have one or more sidewall surfaces 256S.

The opening 256 may have a bottom surface 256B. In one or more embodiments, the openings 256 may have a width W2 and a depth D2.

The opening 256 may be formed using an etch process. The etch process may include a plasma etch process. The etch process may include a Bosch etch process. The etch process may include a dry etch process.

Figure 28:
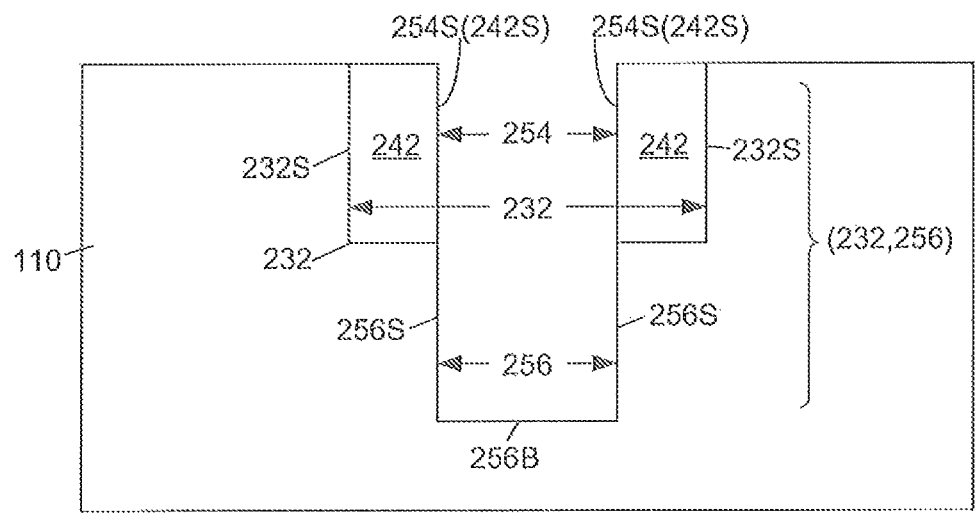

Referring to FIG. 28, the masking layer 260 may be removed to form the structure shown in FIG. 28.

Referring to FIG. 27 and FIG. 28, it is seen that as a result of forming the opening 256, an opening (232,256) may be formed. The opening (232,256) may be viewed as a dual-tier opening comprising an upper portion 232 as well as a lower portion 256. The upper portion 232 is the opening 232 as shown in FIG. 18. As noted above, the opening 232 may be a trench so that the upper portion 232 may also be a trench. The lower portion 256 is the opening 256. As noted, the opening 256 may be a trench so that the lower portion 256 may be a trench.

Referring to FIG. 27 and to FIG. 28, it is seen that the sidewall surfaces 232S of the opening 232 (e.g. upper portion 232 of opening (232,256)) may be covered with the dielectric layers 242 (for example, dielectric blocks 242). The sidewall surfaces 256S of the opening 256 (e.g. lower portion 256 of opening (232,256)) may remain exposed.

Referring to FIG. 27, a first ratio RATIO1 may be defined as RATIO1=D1/(D1+D2). In one or more embodiments, RATIO1 may be less than or equal to 0.9. In one or more embodiments, RATIO1 may be less than or equal to 0.8. In one or more embodiments, RATIO1 may be less than or equal to 0.7. In one or more embodiments, RATIO1 may be less than or equal to 0.6. In one or more embodiments, RATIO1 may be less than or equal to 0.5. In one or more embodiments, RATIO1 may be less than or equal to 0.4. In one or more embodiments, RATIO1 may be less than or equal to 0.3. In one or more embodiments, RATIO1 may be less than or equal to 0.2. In one or more embodiments, RATIO1 may be greater than or equal to 0.1. In one or more embodiments, RATIO1 may be greater than or equal to 0.2. In one or more embodiments, RATIO1 may be greater than or equal to 0.3.

Referring to FIG. 27, a ratio RATIO2 may be defined as RATIO2=W2/W1. In one or more embodiments, RATIO2 may be greater than or equal to 0.1 but less than or equal to 0.9. In one or more embodiments, examples of possible RATIO2 values include 0.2, 0.3, 0.4, 0.5, 0.6, 0.7 and 0.8.

Referring to FIG. 27, a ratio RATIO3 may be defined as RATIO3=D1/W2. In one or more embodiments, RATIO3 may be greater than or equal to 1. In one or more embodiments, RATIO3 may be greater than or equal to 2. In one or more embodiments, RATIO3 may be greater than or equal to 5. In one or more embodiments, RATIO3 may be greater than or equal to 10. In one or more embodiments, RATIO3 may be greater than or equal to 20. In one or more embodiments, RATIO3 may be greater than or equal to 50. In one or more embodiments, RATIO3 may be greater than or equal to 100.

Figure 29:
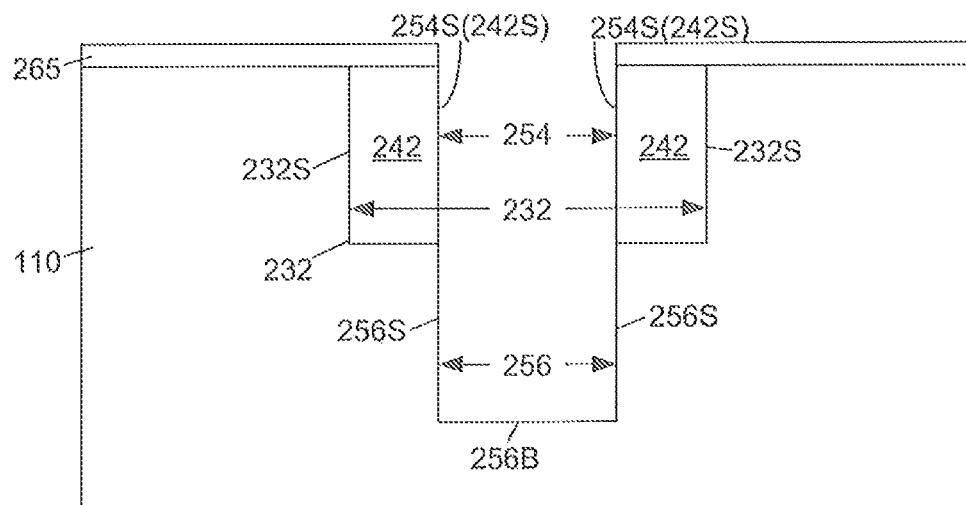

FIG. 29 shows that a dielectric layer 265 may be formed over the top surface of the substrate 110 and optionally over the top surfaces of the dielectric blocks 242. The dielectric layer 265 may, for example, comprise at least one material selected from the group consisting of an oxide, a nitride, and an oxynitride.

Figure 30A:
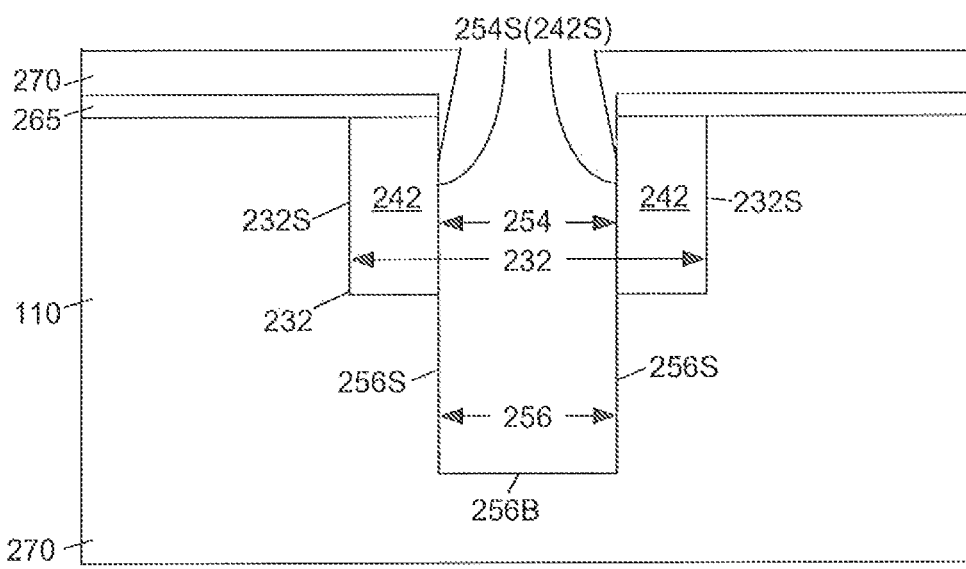

FIG. 30A shows that a conductive layer 270 may be formed over the top surface of the dielectric layer 270. FIG. 30A shows that a conductive layer 270 may be deposited over the structure of FIG. 29 to form the structure shown in FIG. 30A. it is seen that the conductive layer 270 is formed over the top surface of the dielectric layer 265. Also, it is seen that the conductive layer 270 may additionally be formed over the sidewall surfaces 242S of the dielectric layers 242. It is also seen that, in an embodiment, the conductive layer 270 is not formed over the sidewall surfaces 256S of the opening 256. Hence, in the embodiment shown in FIG. 30A the conductive layer 270 is not in direct physical contact or in direct electrical contact with the sidewall surfaces 256S of the substrate (which correspond to the sidewall surfaces 256S of the opening 256). In the embodiment shown, the conductive layer 270 is not in electrical contact with the sidewall surfaces 256S of the substrate. In the embodiment shown in FIG. 30A, the conductive layer 270 is not electrically coupled to the substrate 110 through the sidewall surfaces 256S of the substrate or the sidewall surface 232S of the substrate 232S or the bottom surface 256B. Hence, no electrical shorts exist between the conductive layer 270 and the sidewall surfaces 256S.

Referring to FIG. 30A, the conductive layer 270 may cover only an upper portion (e.g. top portion) of the sidewall surface 242S of the sidewall spacer 242. A lower portion (e.g. bottom portion) of the dielectric blocks 242S may remain free of the conductive layer 270. In an embodiment, the conductive layer 270 may cover substantially all (or all) of the sidewall surfaces 242S. In one or more embodiments, the conductive layer 270 may be formed so that it does not directly contact the sidewall surface 256S. Hence, in one or more embodiments, when the conductive layer 270 is formed, it may be formed on all or a portion of the sidewall surfaces 242S but may not be formed on the sidewall surfaces 256S. In addition, it may not form on the bottom surface 256B of the opening 256. For example, the formation process may include a deposition process (such as a physical vapor deposition process). The dimensions of the opening 232 (for example, depth and/or width) and/or the dimensions of the opening 256 (for example, depth and/or width) may be chosen so that the conductive layer 270 does not form on the sidewall surfaces 256S and/or on the bottom surface 256B of the opening 256.

In an embodiment, the conductive layer 270 may comprise any conductive conductive material. In one or more embodiments, the conductive material may comprise a metallic material. The metallic material may, for example, be a pure metal, an alloy or a compound. It is understood that a pure metal may include some amount of trace impurities. It is also understood that an alloy may include a first metallic element and a second metallic element. An alloy may also include a first metallic element and a non-metallic element (such as steel). As examples, the conductive layer 270 may comprise one or more materials selected from the group consisting of pure copper, copper alloy, pure aluminum, aluminum alloy, pure silver, silver alloy, pure gold, and gold alloy.

The conductive layer 270 may represent a metallization level (or metallization layer) of a semiconductor device. The metallization level may be the first metallization level (e.g. Metal 1) or some other metallization level (such as Metal 2, Metal 3, etc).

The conductive layer 270 may be formed by a deposition process. In one or more embodiments, the deposition process may be a non-conformal deposition process. In one or more embodiments, the deposition process may be a physical vapor deposition (PVD) process. In one or more embodiments, the physical vapor deposition process may be a blanket process. In one or more embodiments, it is possible that the deposition process include a conformal deposition process.

Referring to FIG. 30A it is seen that, in one or more embodiments, it is possible that the sidewall spacers 242 may prevent the conductive material of conductive layer 270 from reaching the sidewalls 232S of the opening 232. In addition, the conductive material of the conductive layer 270 may not be able to reach the sidewall surfaces 256S of the opening 256. This may be at least partially due to the dimensions (for example, the depth and width) of the openings 232 and 256. In addition, the conductive material of the conductive layer 270 may not be able to reach the bottom surface 256B of the opening 256.

Hence, in one or more embodiments, the conductive layer 270 may deposit onto the sidewall surfaces 242S of the sidewall spacers 242. The conductive layer 270 layer may not deposit onto the sidewall surfaces 256S of the opening 256. In addition, the conductive layer 270 may not deposit onto the bottom surface 256B of the opening 256.

In one or more embodiments, there may be a lower portion of the sidewall surfaces 242S of the sidewall spacers 242 where the conductive layer 270 is not formed (for example, not deposited).

Figure 30B:
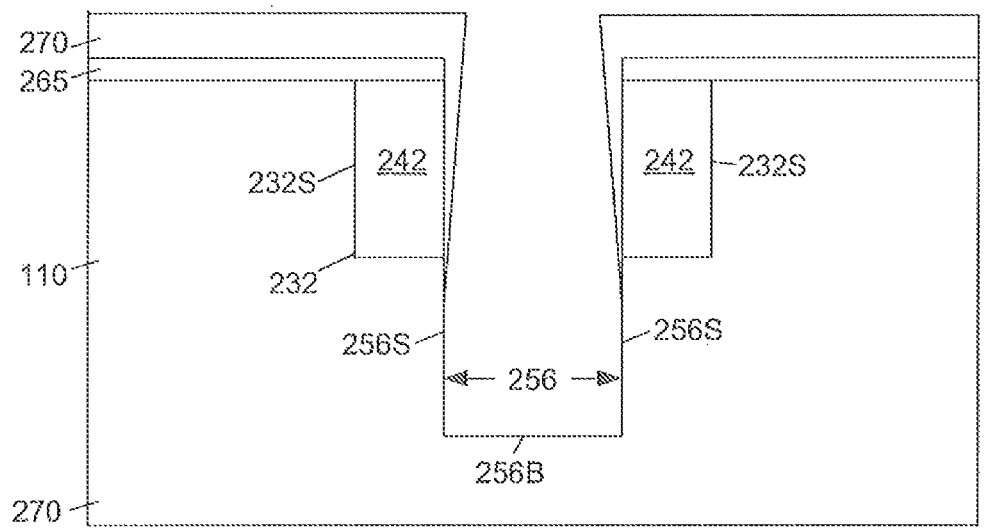
Figure 30C:
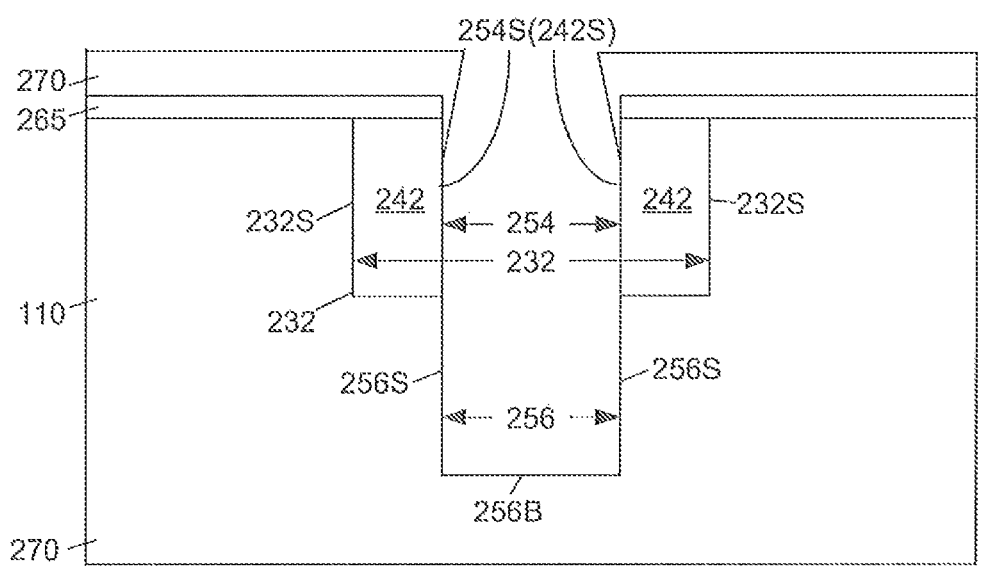

Referring to FIG. 30B, in one or more embodiments, it one or more embodiments, it is instead possible that the conductive layer 270 is formed so that a portion of it also forms on the sidewall surface 233S and/or on the bottom surface 233B. Referring to FIG. 30C, it may then be removed from the surfaces of the opening 256. This removal process may be accomplished by a etching process such as by an etching process.

The conductive layer 270 may represent a metallization level of a semiconductor structure. For example, the conductive layer 270 may represent a first metallization level (e.g. Metal-1) of a semiconductor structure. In one or more embodiments, the conductive layer 270 may comprise a metallic material. In one or more embodiments, the conductive layer 270 may include or may be a metallic layer. Referring again to FIG. 30A, the conductive layer 270 (which may, for example, be a metallic layer) may be formed by a deposition process. The deposition process may include a physical vapor deposition (PVD) process.

Figure 30D:
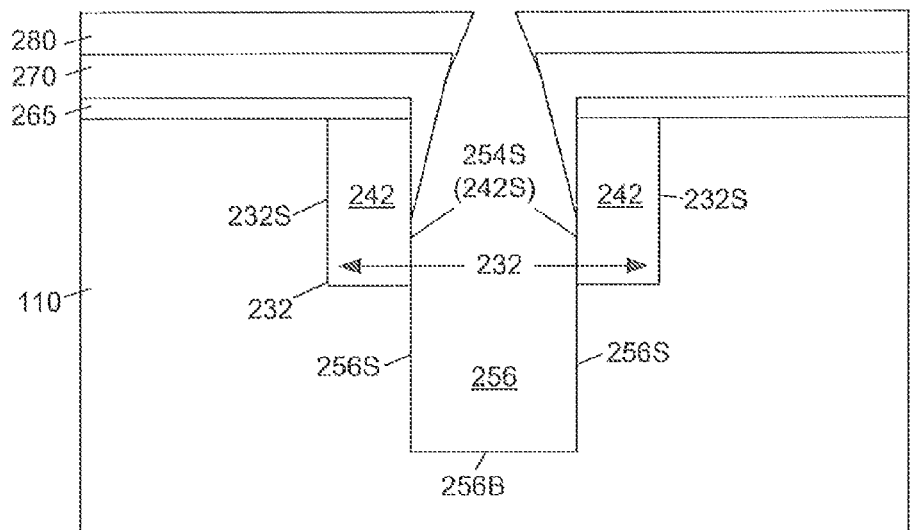

After formation of the conductive layer 270, one or more additional layers may be formed over the structure shown in FIG. 30A (or FIG. 30C) to form the structure shown in, FIG. 30D. The one or more additional layers is represented as the layer 280 shown in FIG. 30D. The layer 280 may, for example, include one or more dielectric layers and/or one or more conductive layers. Hence, one or more additional dielectric layers and/or one or more metallization levels may be added to the structure shown in FIG. 30A (or FIG. 30C) so as to form a structure shown in FIG. 30D having one or more metallization levels (for example, a plurality of metallization levels). The structure shown in FIG. 30D may represent a finished wafer. Referring to FIG. 30D, it is seen that, in one or more embodiments, the layer 280 may not directly contact the sidewalls 256S of the substrate 110. Hence, it is seen that, in one or more embodiments, the one or more additional layer represented by layer 280 may not directly contact the sidewalls 256S of the substrate 110.

FIG. 31 shows that the structure shown in FIG. 30D (which may, for example, represent a finished wafer) may be separated (for example, singulated) into a plurality of parts 290. Each of the parts 290 may represent a semiconductor chip. In addition, it is seen that the substrate 110 (which may represent a wafer substrate) may be separated into a plurality of chip substrate 110P. The separation process may be performed by a back etch to remove some of the substrate material. The etching process used may include a plasma etching process. It may further include mechanical removal.

Referring to FIGS. 12D and 30D, in one or more embodiments, the conductive layers 170 and 270 may comprise a metallic material. The metallic material may, for example, be a pure metal, an alloy or a compound. The pure metal may, for example, be pure copper, pure aluminum, pure silver or pure gold. The alloy may, for example, be copper alloy, aluminum alloy, silver alloy or gold alloy. In an embodiment, an alloy may include a metallic element and a non-metallic element. In an embodiment, an alloy may include a first metallic element and a second metallic element.

The conductive layers 170 and 270 may represent a metallization level of a semiconductor device. The metallization level may be the first metallization level.

It is noted that a metallic material may comprise any metallic material. The metallic material may be a pure metal, an alloy or a compound. The metallic material may include one or more elements such as Cu, Al, W, Au, or Ag. Examples of metallic materials which may be used include, but are not limited to, copper metal, copper alloy, aluminum metal, aluminum alloy, tungsten metal, tungsten alloy, silver metal, silver alloy, gold metal, and gold alloy. Other examples include metal nitride or carbides. Examples include TaN, TaC, TiN, TiW, WN, WCN, CoWP, CoWP, NiNoP, or combinations thereof.

Additional processes step may be applied to the structure shown in FIG. 30D. For example, the same processing steps shown in FIGS. 13A,B,C may be applied to the structure shown in FIG. 30D. Hence, additional processing steps may include carrier mounting. Additional processing steps may include wafer thinning from the backside (e.g. mechanical grinding and/or spin etching) and/or final separation of a final wafer into individual semiconductor chips or dies.

The process flows described herein may be useful to prevent electrical shots between metallization (for example, metallization levels) and substrate (for example, wafer substrate). The processes may be useful for providing a structure which allows subsequent dicing such as plasma dicing. In one or more embodiments, a feature of the processes may be that the electrical insulation may only be partial. The electrical insulation may be in only a part of the opening (for example, trench) structure such as, for example, in only an upper portion 132 of opening (132,133) shown in FIG. 11 and/or an upper portion 232 of opening (232,256) shown in FIG. 29. Placing the electrical insulation in the upper part of the trench structure may allow lateral access to the bulk silicon of the chip. This may be useful for removal of heat that may result from the dissipation of electrical power.

Figure 31A:
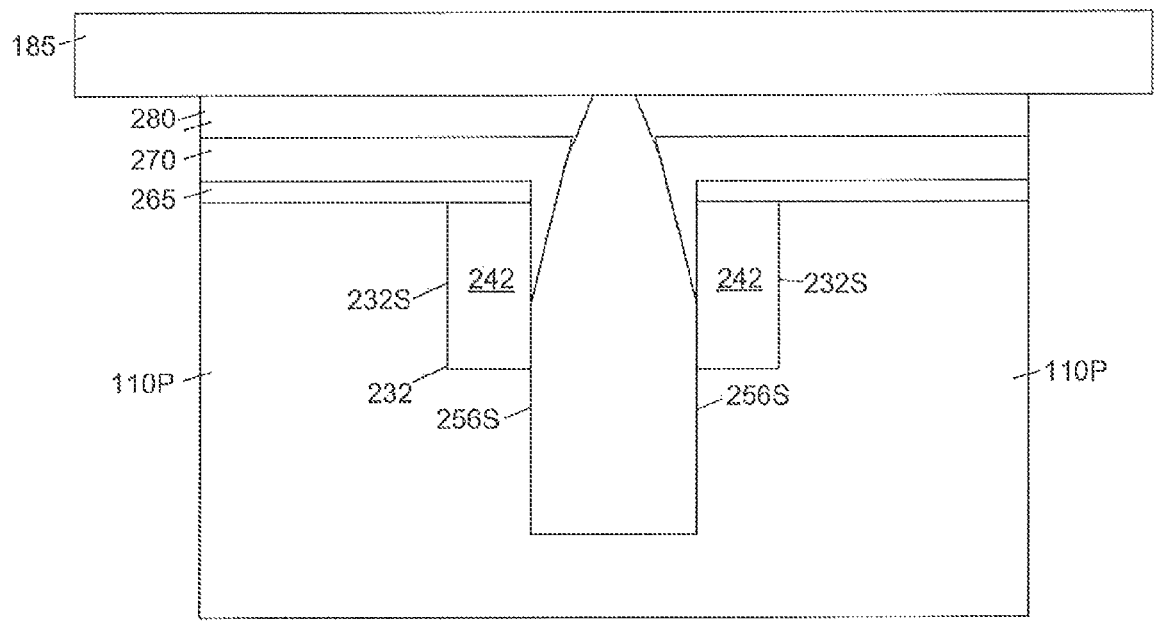
Figure 31B:
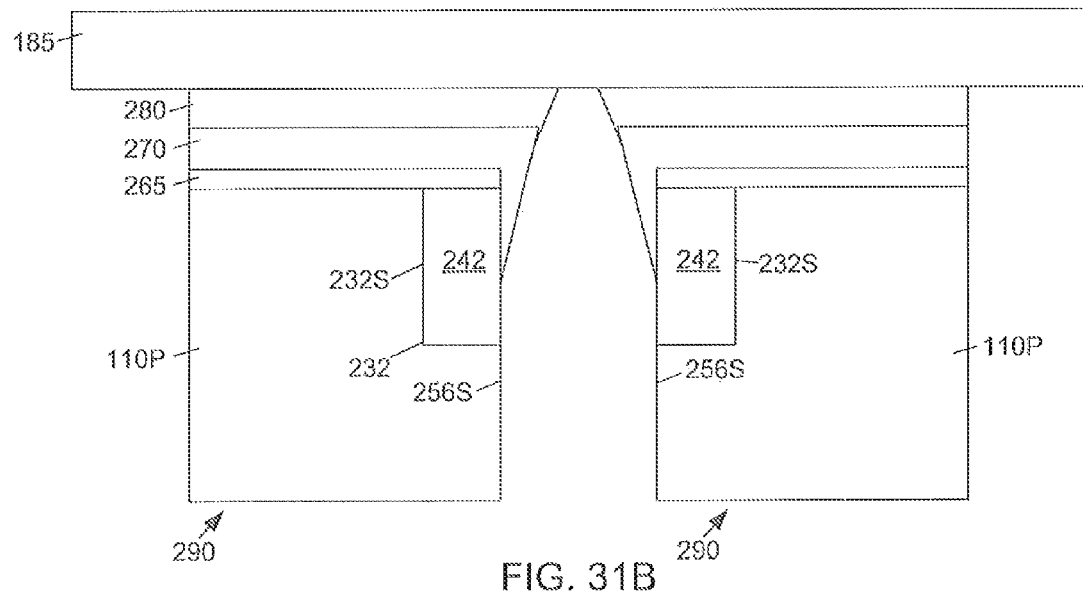
Figure 31C:
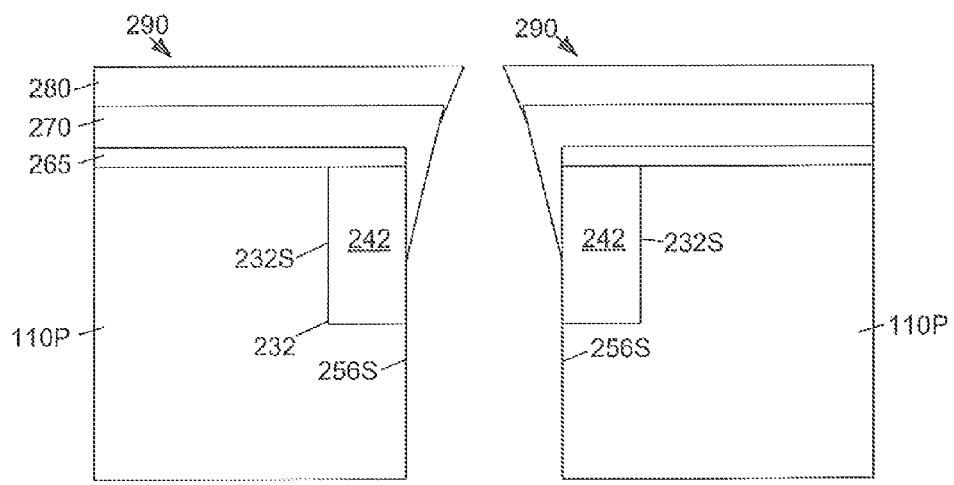

Referring to FIG. 31A, in one or more embodiments, the structure shown in FIG. 30D may be attached to a carrier 185 (for example a carrier substrate or carrier wafer). In one or more embodiments, the structure shown in FIG. 30D may, for example, represent a finished wafer and the front side (e.g. device side) of the finished wafer may be attached to a carrier 185. Referring to FIG. 31B, the finished wafer may be thinned from the back side. The thinning may be accomplished in many ways such as by mechanical grinding or by spin etching. As shown in FIG. 31B, the thinning may separate (e.g. singulate) the structure shown in FIG. 30D into a plurality of parts 290. As noted, the structure shown in FIG. 30B may be a finished wafer so that each of the parts 290 may represent a semiconductor chip 290. As an example, the substrate 110 may be a wafer substrate which may be separated into a plurality of chip substrates 110P. Referring to FIG. 31C, it is seen that each of the semiconductor chips 290 may be removed from the carrier 185.

Referring again to FIG. 30D, it is seen that the substrate 110 may represent a wafer substrate. In one or more embodiments, the opening (232,256) may be in a corresonding kerf region of the wafer substrate. The openings (232,256) may be used to singulate the wafer substrate into individual chip substrates. Likewise, the openings (232,256) may be used to singulate a finished wafer into individual chip substrates.

Figure 32B:
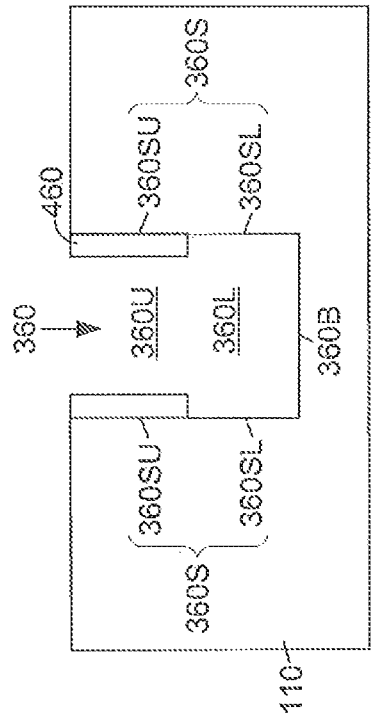
FIGS. 32A through 32B show a method of making a semiconductor structure in accordance with an embodiment.
Figure 32A:
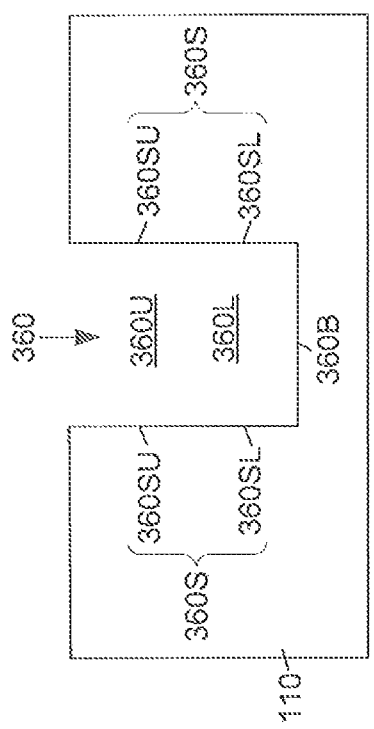

FIGS. 32A and 32B show another embodiment. Referring to FIG. 32A, in one or more embodiments, it is also possible that an opening 360 is formed partially through a substrate 110. The opening 360 may be in the kerf region of the substrate 110. The opening 360 may include an upper portion 360U and a lower portion 360L. The opening 360 may include at least one sidewall surface 360S. The opening 360 may include a bottom surface 360B. The upper portion 360U may include a upper portion 360SU of sidewall surface 360S. The lower portion 360L may include a lower portion 360SL of the sidewall surface 360S.

After the opening 360 (including both the upper and lower portions) is formed, it may then be possible that a dielectric layer 460 be formed over an upper portion 360SU of the sidewall surface 360S but not over a lower portion 360SL of the sidewall surface 360S. In one or more embodiments, there may be a process which permits the formation of a dielectric layer 460 over an upper portion but not a lower portion of a sidewall surface 360S. The process may include a deposition process and/or a growth process.

Figure 33B:
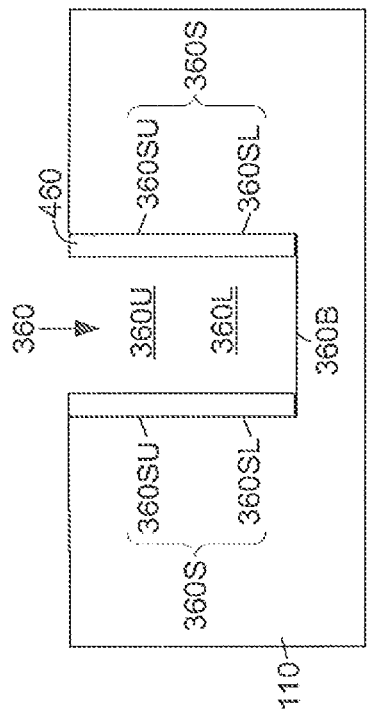
FIGS. 33A through 33D show a method of making a semiconductor structure in accordance with an embodiment.
Figure 33D:
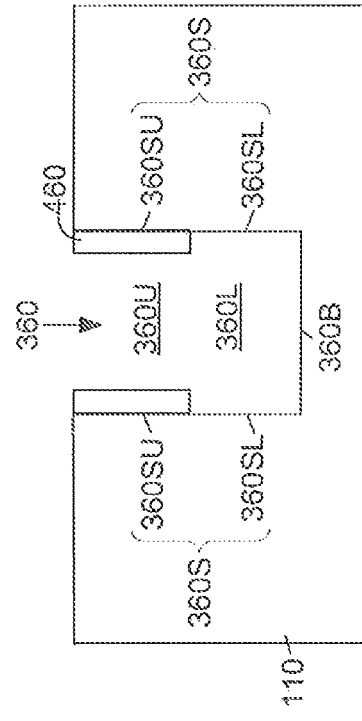
Figure 33A:
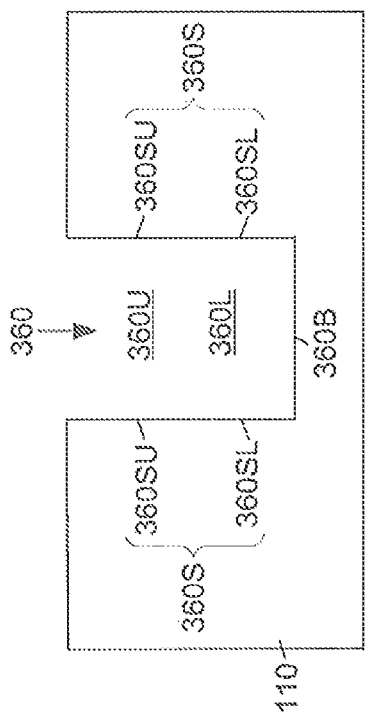
Figure 33C:
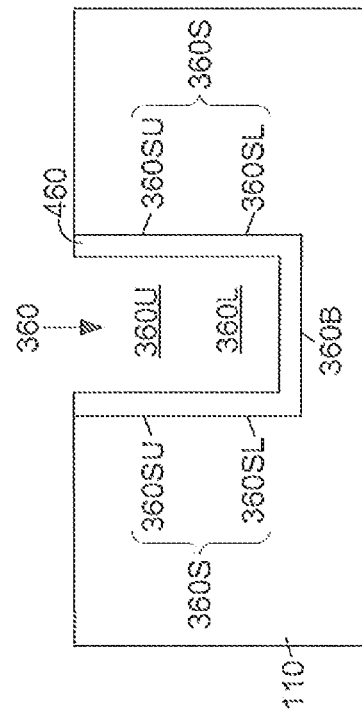

FIGS. 33A through 33D show another embodiment. Referring to FIG. 33A, an opening 360 may be formed as already shown in FIG. 32A. Referring to FIG. 33B, a dielectric layer may be formed over the sidewall surface 360S of both the upper portion 360U and lower portion 360L of the opening 360. Hence, the dielectric layer 460 may be formed over the upper portion 360SU and the lower portion 360SL of the sidewall surface 360S of opening 360. Referring to FIG. 33C, in one or more embodiments, it may also be possible that the dielectric layer 460 may optionally be formed over the bottom surface 360B of the opening 360. Referring to FIG. 33D, it is then possible that the dielectric layer 460 may be removed from the lower portion 360SL of sidewall surface 360S of the opening 360. The dielectric layer 460 may also be removed from the bottom surface 360B if the dielectric layer 460 was also formed there.

Referring, for example, to FIGS. 32B and 33D, it is possible that, in one or more embodiments, the upper portion 360SU of the sidewall surface 360S that may be covered by the dielectric 460 may be at least 10 percent of the sidewall surface 360S. In one or more embodiments, the upper portion 360SU of the sidewall surface 360S that may be covered by the dielectric 460 may be at least 20 percent of the sidewall surface 360S. In one or more embodiments, the upper portion 360SU of the sidewall surface 360S that may be covered by the dielectric 460 may be at least 30 percent of the sidewall surface 360S. In one or more embodiments, the upper portion 360SU of the sidewall surface 360S that may be covered by the dielectric 460 may be at least 40 percent of the sidewall surface 360S. In one or more embodiments, the upper portion 360SU of the sidewall surface 360S that may be covered by the dielectric 460 may be less than or equal to 90 percent of the sidewall surface 360S. In one or more embodiments, the upper portion 360SU of the sidewall surface 360S that may be covered by the dielectric 460 may be less than or equal to 80 percent of the sidewall surface 360S. In one or more embodiments, the upper portion 360SU of the sidewall surface 360S that may be covered by the dielectric 460 may be less than or equal to 70 percent of the sidewall surface 360S. In one or more embodiments, the upper portion 360SU of the sidewall surface 360S that may be covered by the dielectric 460 may be less than or equal to 60 percent of the sidewall surface 360S.

Figure 34B:
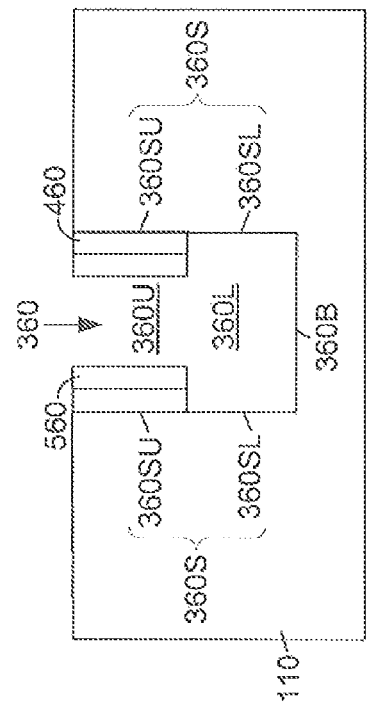
FIGS. 34A through 34B show a method of making a semiconductor structure in accordance with an embodiment.
Figure 34A:
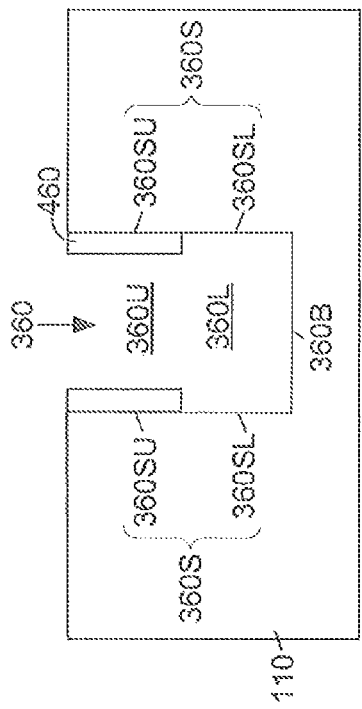

FIGS. 34A through 34B show another embodiment of the invention. FIG. 34A shows the structure from FIG. 32B or the structure from FIG. 33D (it could, for example, be either one). FIG. 34B shows that a conductive layer 560 may be formed over the dielectric layer 460 but not over the exposed lower portion 360SL of the sidewall surface 360S of lower portion 360L. In one or more embodiments, there may be a process which permits the formation of a conductive layer 560 over the dielectric layer 460 but not over the lower portion 360SL of the sidewall surface 360S. Also, in one or more embodiment, it is possible that the same process may not allow for the formation of the conductive layer 560 over the bottom surface 360B. The process may, for example, include a deposition process and/or a growth process.

Figure 35A:
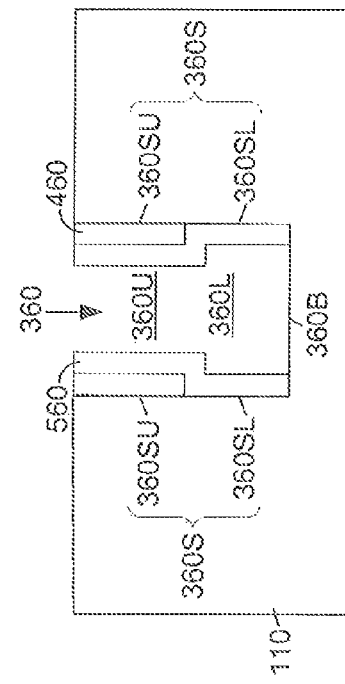
FIG. 35A through 35D show a method of making a semiconductor structure in accordance with an embodiment.
Figure 35B:
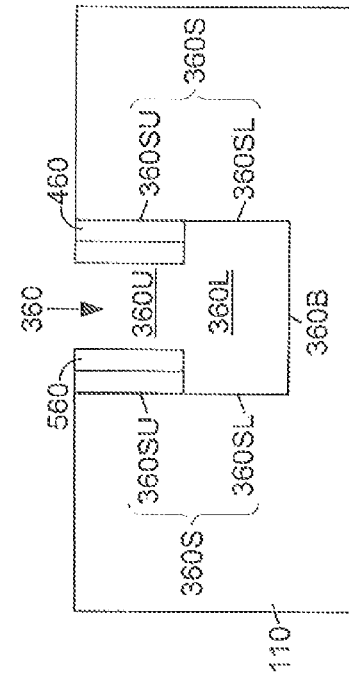
Figure 35C:
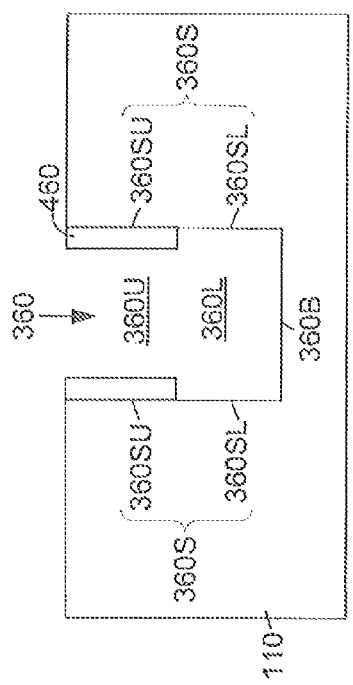
Figure 35D:
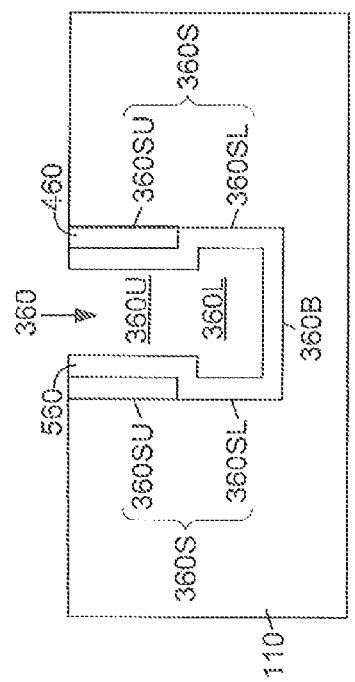

FIGS. 35A through 35D show another embodiment of the invention. FIG. 35A shows the structure from FIG. 32B or the structure from FIG. 33D (it could, for example, be either one). FIG. 35B shows that the conductive layer 560 may be formed over the dielectric layer 460 as well as over the lower portion 360LS of the sidewall surface 360S. Referring to FIG. 35C, in another embodiment, the conductive layer 560 may additionally be formed over the bottom surface 360B. Referring to FIG. 35D, it is seen that the conductive layer 560 may be removed from the lower portion 360LS of the sidewall surface 360S. The conductive layer 560 may also be removed from the bottom surface 360B (if it were formed there).

The substrate 110 has been discussed above and the discussion applies to the embodiments shown in FIGS. 32,33,34 and 35. The dielectric layer 460 may include one or more of the same materials as the dielectric layers 142 and 242 described above. Also, the conductive layer 560 may include one or more of the same materials as the conductive layers 170 and 270 described above.

In one or more embodiments, the opening 360 may be formed using a single etching process to form both the upper portions 360U and the lower portions 360U. In one or more embodiments, more than one etching process may be used.

One or more embodiments may include a method of making a semiconductor structure, comprising: forming a first opening partially through a semiconductor substrate; forming a first dielectric layer over a sidewall surface of the first opening; and forming a second opening partially through a semiconductor substrate, the second opening being below the first opening.

One or more embodiments may include a method of making a semiconductor structure, comprising: forming a opening partially through a semiconductor substrate, the opening including an upper portion and a lower portion; and forming a first dielectric layer over a sidewall surface of the upper portion but not over a sidewall surface of the lower portion.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method of making a semiconductor structure, comprising:
    forming a first opening partially through a semiconductor substrate;
    forming a first dielectric layer over a sidewall surface of said first opening;
    forming a second opening partially through said semiconductor substrate, said second opening being below said first opening; and
    forming a conductive material over a sidewall surface of said first dielectric layer, said conductive material not being in direct contact with said second opening.

2. The method of claim 1, wherein said first opening and said second opening are in the kerf region of said semiconductor substrate.

3. The method of claim 1, wherein said forming said conductive material does not form said conductive material in direct contact with said sidewall surface of said second opening.

4. The method of claim 1, wherein said forming said conductive material also forms said conductive material in direct contact with a sidewall surface of said second opening, said method further comprising removing said conductive material formed in direct contact with said sidewall surface of said second opening.

5. The method of claim 1, wherein said forming said first opening comprises an etching process.

6. The method of claim 5, wherein said etching process comprises a plasma etching process.

7. The method of claim 5, wherein said etching process comprises a Bosch etching process.

8. The method of claim 1, further comprising, after forming said conductive material, removing a portion of said semiconductor substrate so as to separate said semiconductor substrate into a plurality of spaced apart portions.

9. The method of claim 1, wherein said conductive material comprises a metallic material.

10. The method of claim 1, wherein said forming said conductive material comprises depositing said conductive material.

11. The method of claim 10, wherein said depositing said conductive material comprises a physical vapor deposition process.

12. The method of claim 10, wherein said depositing said conductive material comprises a non-conformal deposition process.

13. The method of claim 1, further comprising, before forming said conductive material, forming a second dielectric layer over a top surface of said semiconductor substrate, said conductive material being formed over said second dielectric layer.

14. The method of claim 1, wherein said substrate is a wafer substrate.

15. The method of claim 1, wherein said forming said first dielectric layer includes forming a sidewall spacer over said sidewall surface of said first opening.

16. The method of claim 15, wherein said forming said sidewall spacer includes
conformally despositing said first dielectric layer, and
anisotropically etching said first dielectric layer.

17. The method of claim 15, wherein said forming said first dielectric layer includes forming a dielectric block over a sidewall surface of said first opening.

18. The method of claim 17, wherein said forming said dielectric block includes filling said first opening with a dielectric material.

19. The method of claim 1, wherein a second dielectric layer is formed over a top surface of said semiconductor substrate, said conductive material being formed over said second dielectric layer.

20. The method of claim 1, wherein forming said second opening includes using said first dielectric layer as a mask.

* * * * *